US012777812B2

(12) United States Patent
Kubota et al.

(10) Patent No.: US 12,777,812 B2
(45) Date of Patent: Oct. 27, 2026

(54) DISPLAY APPARATUS, DISPLAY MODULE, AND ELECTRONIC DEVICE

(71) Applicant: SEMICONDUCTOR ENERGY LABORATORY CO., LTD., Atsugi (JP)

(72) Inventors: Daisuke Kubota, Atsugi (JP); Ryo Hatsumi, Hadano (JP); Taisuke Kamada, Niiza (JP); Koji Kusunoki, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 407 days.

(21) Appl. No.: 18/286,840

(22) PCT Filed: Apr. 18, 2022

(86) PCT No.: PCT/IB2022/053596
§ 371 (c)(1),
(2) Date: Oct. 13, 2023

(87) PCT Pub. No.: WO2022/229779
PCT Pub. Date: Nov. 3, 2022

(65) Prior Publication Data

US 2024/0196688 A1 Jun. 13, 2024

(30) Foreign Application Priority Data

Apr. 30, 2021 (JP) ................................. 2021-077437

(51) Int. Cl.
*H10K 59/35* (2023.01)
*H10K 39/34* (2026.01)
(Continued)

(52) U.S. Cl.
CPC ........... *H10K 59/805* (2023.02); *H10K 39/34* (2023.02); *H10K 50/00* (2023.02); *H10K 59/00* (2023.02);
(Continued)

(58) Field of Classification Search
CPC ...... H10K 59/805; H10K 39/34; H10K 50/00; H10K 59/00; H10K 59/353; H10K 59/65;
(Continued)

(56) References Cited

U.S. PATENT DOCUMENTS 11,487,373 B2 11/2022 Kubota et al.
11,659,758 B2 5/2023 Kamada et al.
(Continued)

FOREIGN PATENT DOCUMENTS

CN 110233162 A 9/2019
CN 112186111 A 1/2021
(Continued)

OTHER PUBLICATIONS

International Search Report (Application No. PCT/IB2022/053596) Dated Jul. 5, 2022.
(Continued)

*Primary Examiner* — Tong-Ho Kim
(74) *Attorney, Agent, or Firm* — NIXON PEABODY LLP; Jeffrey L. Costellia

(57) ABSTRACT

A high-resolution display apparatus having a function of detecting light is provided. The display apparatus includes a light-receiving device and a light-emitting device, the light-receiving device includes a first electrode, an active layer over the first electrode, and a second electrode over the active layer, the light-emitting device includes a third electrode, a light-emitting layer over the third electrode, and the second electrode over the light-emitting layer, and a part of the active layer and a part of the light-emitting layer overlap
(Continued)

with each other in an outer side of the first electrode and an outer side of the third electrode in a top view.

13 Claims, 16 Drawing Sheets

(51) Int. Cl.
*H10K 50/00* (2023.01)
*H10K 59/00* (2023.01)
*H10K 59/65* (2023.01)
*H10K 59/80* (2023.01)
*H10K 102/00* (2023.01)

(52) U.S. Cl.
CPC ........... *H10K 59/353* (2023.02); *H10K 59/65* (2023.02); *H10K 59/875* (2023.02); *H10K 2102/311* (2023.02)

(58) Field of Classification Search
CPC ........... H10K 59/875; H10K 2102/311; H10K 50/11; H10K 59/60; H10K 59/771; H10K 30/60; H10K 30/81; H10K 39/501; H10K 59/8051; H10K 59/8052; H10K 59/90; H10K 65/00; H10K 77/111; G06F 3/041; G06F 3/042; G09F 9/00; G09F 9/30; G09F 9/301; H05B 33/02; H05B 33/12
USPC ............................................................ 257/91
See application file for complete search history.

(56) References Cited

U.S. PATENT DOCUMENTS

| | | | |
|---|---|---|---|
| 11,755,905 B2 | 9/2023 | Yamazaki et al. | |
| 2013/0299789 A1 | 11/2013 | Yamazaki et al. | |
| 2019/0278968 A1 | 9/2019 | Yoshii et al. | |
| 2021/0005669 A1* | 1/2021 | Kamada | H10K 59/40 |
| 2021/0066669 A1 | 3/2021 | Kubota et al. | |
| 2021/0096678 A1 | 4/2021 | Kubota et al. | |
| 2021/0279449 A1 | 9/2021 | Yamazaki et al. | |
| 2021/0327979 A1 | 10/2021 | Kamada et al. | |
| 2022/0115446 A1* | 4/2022 | Kamada | H10K 59/351 |
| 2022/0173174 A1 | 6/2022 | Hatsumi et al. | |
| 2023/0032743 A1 | 2/2023 | Kubota et al. | |
| 2023/0255094 A1 | 8/2023 | Kamada et al. | |

FOREIGN PATENT DOCUMENTS

| | | | |
|---|---|---|---|
| CN | 112313701 | A | 2/2021 |
| CN | 112578933 | A | 3/2021 |
| JP | 2014-197522 | A | 10/2014 |
| JP | 2021-012366 | A | 2/2021 |
| JP | 2021-057039 | A | 4/2021 |
| KR | 2019-0107215 | A | 9/2019 |
| KR | 2021-0004867 | A | 1/2021 |
| KR | 2021-0022642 | A | 3/2021 |
| KR | 2021-0037556 | A | 4/2021 |
| KR | 2021-0116511 | A | 9/2021 |
| TW | 202032826 | | 9/2020 |
| TW | 202104541 | | 2/2021 |
| WO | WO-2019/243955 | | 12/2019 |
| WO | WO-2020/148600 | | 7/2020 |

OTHER PUBLICATIONS

Written Opinion (Application No. PCT/IB2022/053596) Dated Jul. 5, 2022.

* cited by examiner 105
111C
111S
111B
216
111G
111R 105
111C
111S
111B
216
111G
112
111R 105
111C
111S
111B
216
151G
113G
111G
112
111R

100B

DISPLAY APPARATUS, DISPLAY MODULE, AND ELECTRONIC DEVICE

TECHNICAL FIELD

One embodiment of the present invention relates to a display apparatus, a display module, and an electronic device. One embodiment of the present invention relates to a display apparatus including a light-receiving device and a light-emitting device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, display apparatuses have been expected to be applied to a variety of uses. Examples of uses for a large display apparatus include a television device for home use (also referred to as a TV or a television receiver), digital signage, and a PID (Public Information Display). In addition, a smartphone and a tablet terminal including a touch panel are being developed as portable information terminals.

Light-emitting apparatuses including light-emitting devices (also referred to as light-emitting elements) have been developed as display apparatuses, for example. Light-emitting devices utilizing electroluminescence (hereinafter referred to as EL) (such a device is also referred to as EL devices or EL elements) have features such as ease of reduction in thickness and weight, high-speed response to input signals, and driving with a constant DC voltage power source, and have been used in display apparatuses. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a high-resolution display apparatus having a function of detecting light. An object of one embodiment of the present invention is to provide a highly convenient display apparatus. An object of one embodiment of the present invention is to provide a multifunctional display apparatus. An object of one embodiment of the present invention is to provide a display apparatus with high display quality. An object of one embodiment of the present invention is to provide a display apparatus with high light sensitivity. An object of one embodiment of the present invention is to provide a novel display apparatus.

Note that the description of these objects does not preclude the existence of other objects. One embodiment of the present invention does not need to achieve all the objects.

Other objects can be derived from the descriptions of the specification, the drawings, and the claims.

Means for Solving the Problems

One embodiment of the present invention is a display apparatus including a light-receiving device and a light-emitting device. The light-receiving device includes a first electrode, an active layer over the first electrode, and a second electrode over the active layer. The light-emitting device includes a third electrode, a light-emitting layer over the third electrode, and the second electrode over the light-emitting layer. A part of the active layer and a part of the light-emitting layer overlap with each other in an outer side of the first electrode and an outer side of the third electrode in a top view.

The light-receiving device and the light-emitting device preferably include a common layer. The common layer preferably includes a portion positioned between the first electrode and the second electrode and a portion positioned between the first electrode and the third electrode.

The light-emitting layer preferably includes a portion positioned over the active layer.

One embodiment of the present invention is a display apparatus including a light-receiving device, a first light-emitting device, and a second light-emitting device. The light-receiving device includes a first electrode, an active layer over the first electrode, and a second electrode over the active layer. The first light-emitting device includes a third electrode, a first light-emitting layer over the third electrode, and the second electrode over the first light-emitting layer. The second light-emitting device includes a fourth electrode, a second light-emitting layer over the fourth electrode, and the second electrode over the second light-emitting layer. The first light-emitting layer and the second light-emitting layer include light-emitting materials different from each other. The active layer includes a portion positioned between the first light-emitting layer and the second light-emitting layer in a cross-sectional view.

The light-receiving device, the first light-emitting device, and the second light-emitting device preferably include a common layer. The common layer preferably includes a portion positioned between the first electrode and the second electrode, a portion positioned between the first electrode and the third electrode, and a portion positioned between the fourth electrode and the third electrode.

The display apparatus having any of the above structures preferably has flexibility.

One embodiment of the present invention is a display module including the display apparatus having any of the above structures. Examples of the display module includes a display module provided with a connector such as a flexible printed circuit (hereinafter referred to FPC) or a TCP (Tape Carrier Package), or a display module on which an integrated circuit (IC) is implemented by a COG (Chip On Glass) method, a COF (Chip On Film) method, or the like.

One embodiment of the present invention is an electronic device including the above display module and at least one of a housing, a battery, a camera, a speaker, and a microphone.

Effect of the Invention

According to one embodiment of the present invention, a high-resolution display apparatus having a function of detecting light can be provided. According to one embodiment of the present invention, a highly convenient display apparatus can be provided. According to one embodiment of the present invention, a multifunction display apparatus can be provided. According to one embodiment of the present invention, a display apparatus with high display quality can be provided. According to one embodiment of the present invention, a display apparatus with high light sensitivity can be provided. According to one embodiment of the present invention, a novel display apparatus can be provided.

Note that the description of these effects does not preclude the existence of other effects. One embodiment of the present invention does not need to have all the effects. Other effects can be derived from the descriptions of the specification, the drawings, and the claims.

MODE FOR CARRYING OUT THE INVENTION

Figure 1A:
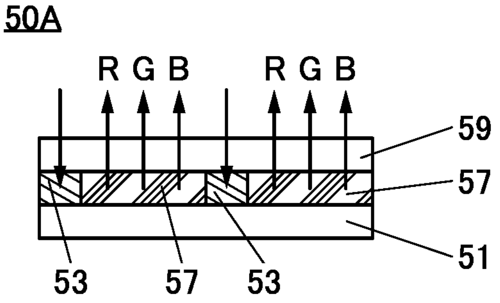
FIG. 1A to FIG. 1D are cross-sectional views illustrating examples of display apparatuses.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatching pattern is used for the portions having similar functions, and the portions are not especially denoted by reference numerals in some cases.

In addition, the position, size, range, and the like of each structure illustrated in drawings do not represent the actual position, size, range, and the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, a device manufactured using a metal mask or an FMM (fine metal mask, a high resolution metal mask) may be referred to as a device having an FMM structure or a device having an MM (metal mask) structure. In this specification and the like, a device formed without using a metal mask or an FMM may be referred to as a device having an MML (metal maskless) structure.

Embodiment 1

In this embodiment, a display apparatus of one embodiment of the present invention will be described with reference to FIG. 1A to FIG. 11B.

The display apparatus of this embodiment includes light-receiving devices and light-emitting devices in its display portion. In the display apparatus of this embodiment, the light-emitting devices are arranged in a matrix in the display portion, and an image can be displayed on the display portion. Moreover, the light-receiving devices are arranged in a matrix in the display portion, so that the display portion also has a function of a light-receiving portion. The light-receiving portion can be used as one or both of an image sensor and a touch sensor. That is, by detecting light with the light-receiving portion, an image can be captured and an approach or contact of an object (e.g., a finger or a stylus) can be detected.

Furthermore, in the display apparatus of this embodiment, the light-emitting devices can be used as a light source of the sensor. For example, an image can be displayed by using all subpixels included in the display apparatus; or light can be emitted by some of the subpixels as a light source, light can be detected by some other pixels, and an image can be displayed by using the remaining subpixels. Accordingly, a light-receiving portion and a light source do not need to be provided separately from the display apparatus; hence, the number of components of an electronic device can be reduced. For example, a fingerprint authentication device, a capacitive touch panel for scroll operation, or the like is not necessarily provided separately from the electronic device. Thus, with the use of the display apparatus of one embodiment of the present invention, the electronic device can be provided with reduced manufacturing cost.

In the display apparatus of one embodiment of the present invention, when an object reflects (or scatters) light emitted from the light-emitting device included in the display portion, the light-receiving device can detect reflected light (or scattered light); thus, image capturing or touch detection is possible even in a dark place.

The display apparatus of this embodiment has a function of displaying an image using the light-emitting devices. That is, the light-emitting devices function as display devices (also referred to as display elements).

As the light-emitting device, an OLED (Organic Light Emitting Diode) or a QLED (Quantum-dot Light Emitting Diode) is preferably used, for example. Examples of a light-emitting substance (also referred to as a light-emitting material) contained in the light-emitting device include a substance emitting fluorescent light (a fluorescent material), a substance emitting phosphorescent light (a phosphorescent material), and a substance exhibiting thermally activated delayed fluorescence (Thermally Activated Delayed Fluorescence (TADF) material). Alternatively, an LED (Light Emitting Diode) such as a micro-LED can be used as the light-emitting device. As the light-emitting substance contained in the light-emitting device, inorganic compounds (e.g., quantum dot materials) can be used.

The display apparatus of this embodiment has a function of detecting light with the use of the light-receiving device.

When the light-receiving device is used as an image sensor, the display apparatus of this embodiment can capture an image using the light-receiving device. For example, the display apparatus of this embodiment can be used as a scanner.

For example, data on a fingerprint, a palm print, an iris, or the like can be obtained with the image sensor. That is, a biological authentication sensor can be incorporated in the display apparatus of this embodiment. When the display apparatus incorporates a biological authentication sensor, the number of components of an electronic device can be reduced as compared to the case where the biological authentication sensor is provided separately from the display apparatus; thus, the size and weight of the electronic device can be reduced.

In addition, data on facial expression, eye movement, change of the pupil diameter, or the like of a user can be obtained with the image sensor. By analysis of the data, data on the user's physical and mental state can be obtained. Changing the output contents of one or both of display and sound on the basis of the data allows the user to safely use a device for VR (Virtual Reality), AR (Augmented Reality), or MR (Mixed Reality), for example.

When the light-receiving device is used as a touch sensor, the display apparatus of this embodiment can detect an approach or contact of an object with the use of the light-receiving device.

As the light-receiving device, a PN photodiode or a PIN photodiode can be used, for example. The light-receiving device functions as a photoelectric conversion device (also referred to as a photoelectric conversion element) that detects light entering the light-receiving device and generates electric charge. The amount of generated electric charge depends on the amount of incident light.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL devices and the organic photodiodes can be formed over one substrate. Thus, the organic photodiodes can be incorporated in the display apparatus including the organic EL devices.

If all layers of the organic EL devices and the organic photodiodes are formed separately, the number of film formation steps becomes extremely large. Since a large number of layers of the organic photodiodes can have a structure in common with the layers of the organic EL devices, forming the layers that can have a common structure concurrently can inhibit the increase in the number of film formation steps. Even when the number of film formation steps is the same, reducing the number of layers formed only in either device can suppress the influence of deviation of a film formation pattern and the influence of dust (including small foreign substances called particles) attached to a deposition mask (e.g., a metal mask), for example. Thus, the yield in the manufacture of the display apparatus can be increased.

For example, at least one of a hole-injection layer, a hole-transport layer, an electron-transport layer, and an electron-injection layer is preferably a layer shared by the light-receiving device and the light-emitting device. Accordingly, the number of film formation steps and the number of masks can be reduced, thereby reducing the number of manufacturing steps and the manufacturing cost of the display apparatus. Note that a layer shared by the light-receiving device and the light-emitting device may have a different function depending on which device the layer is in. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. The layer shared by the light-receiving device and the light-emitting device have the same function in both the light-emitting device and the light-receiving device in some cases. The hole-transport layer functions as a hole-transport layer in both the light-emitting device and the light-receiving device, and the electron-transport layer functions as an electron-transport layer in both the light-emitting device and the light-receiving device.

A light-emitting layer included in the light-emitting device and an active layer included in the light-receiving device can be each formed in an island shape using a fine metal mask (also referred to as a metal mask or a shadow mask). In the case where a high-resolution display apparatus is manufactured, for example, the display apparatus can have a portion where an end portion of the light-emitting layer and an end portion of the active layer overlap with each other. With the use of a fine metal mask, the high-resolution display apparatus having higher than or equal to 300 ppi or higher than or equal to 500 ppi and lower than or equal to 1000 ppi or lower than or equal to 800 ppi can be manufactured.

When light-emitting layers in light-emitting devices emitting light of different colors overlap with each other, side leakage might occur and thus, display quality is degraded in some case. For example, in the case where a phosphorescent light-emitting device is used as both a light-emitting device emitting red light and a light-emitting device emitting green light, light-emitting layers of the light-emitting devices can be formed by dispersing a red light-emitting material for the red light-emitting device and a green light-emitting material for the green light-emitting device in the same host material. In the case where structures of light-emitting layers are similar in this manner, side leakage is likely to occur. Therefore, the light-emitting devices preferably have a structure in which the red light-emitting layer and the green light-emitting layer are not directly in contact with each other or a structure in which an area where the red light-emitting layer and the green light-emitting layer are directly in contact with each other is reduced. For this reason, it is preferable that a step of forming an active layer be performed between a step of forming the red light-emitting layer and a step of forming the green light-emitting layer. Thus, a portion where the active layer is positioned between the red light-emitting layer and the green light-emitting layer is generated, so that the area where the red light-emitting layer and the green light-emitting layer are directly in contact with each other can be reduced. Accordingly, side leakage that occurs between the light-emitting devices emitting light of different colors can be inhibited. Therefore, the display apparatus having high display quality can be achieved.

Structure Example 1 of Display Apparatus

FIG. 1A to FIG. 1D are cross-sectional views of display apparatuses of one embodiment of the present invention.

A display apparatus 50A illustrated in FIG. 1A includes a layer 53 including a light-receiving device and a layer 57 including a light-emitting device, between a substrate 51 and a substrate 59.

Figure 1B:
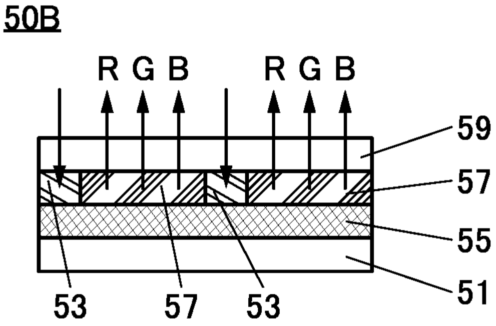

A display apparatus 50B illustrated in FIG. 1B includes the layer 53 including a light-receiving device, a layer 55 including a transistor, and the layer 57 including a light-emitting device, between the substrate 51 and the substrate 59.

In the display apparatus 50A and the display apparatus 50B, red (R) light, green (G) light, and blue (B) light are emitted from the layer 57 including a light-emitting device.

The display apparatus of one embodiment of the present invention includes a plurality of pixels arranged in a matrix. One pixel includes one or more subpixels. One subpixel includes one light-emitting device. For example, a pixel can include three subpixels (e.g., three colors of R, G, and B or three colors of yellow (Y), cyan (C), and magenta (M)) or four subpixels (e.g., four colors of R, G, B, and white (W), four colors of R, G, B, and Y, or four colors of R, G, B, and infrared light (IR)). The pixel also includes a light-receiving device. The light-receiving device may be provided in all the pixels or in some of the pixels. In addition, one pixel may include a plurality of light-receiving devices.

The layer 55 including a transistor preferably includes a first transistor and a second transistor. The first transistor is electrically connected to the light-receiving device. The second transistor is electrically connected to the light-emitting device.

Figure 1C:
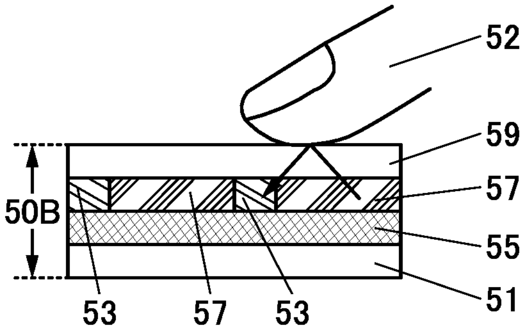

The display apparatus of one embodiment of the present invention may have a function of detecting an object such as a finger that is touching the display apparatus. For example, after light emitted from a light-emitting device in the layer 57 including the light-emitting device is reflected by a finger 52 that touches the display apparatus 50B as illustrated in FIG. 1C, a light-receiving device in the layer 53 including the light-receiving device detects the reflected light. Thus, the touch of the finger 52 on the display apparatus 50B can be detected.

Figure 1D:
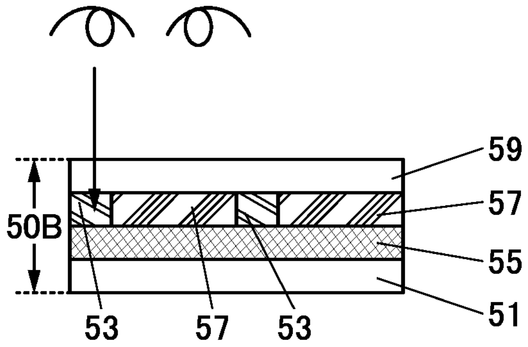

The display apparatus of one embodiment of the present invention may have a function of detecting or capturing an image of an object that is approaching (but is not touching) the display apparatus 50B as illustrated in FIG. 1D.

Figure 1E:
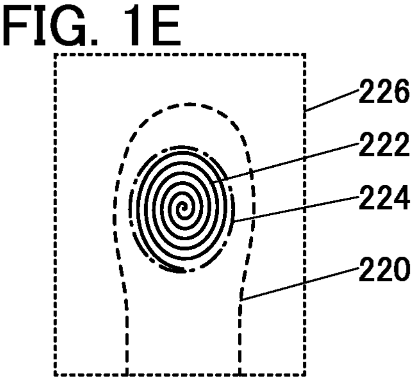
FIG. 1E is a diagram illustrating an example of an image.

FIG. 1E illustrates an example of an image of a fingerprint captured by the display apparatus of one embodiment of the present invention. In an image-capturing range 226 in FIG. 1E, the outline of a finger 220 is indicated by a dashed line and the outline of a contact portion 224 is indicated by a dashed-dotted line. In the contact portion 224, a high-contrast image of a fingerprint 222 can be captured owing to a difference in the amount of light entering the light-receiving device.

[Pixel layout]

A pixel layout of the display apparatus of one embodiment of the present invention will be described. There is no particular limitation on the arrangement of subpixels included in pixels, and a variety of methods can be employed. The arrangement of subpixels may be stripe arrangement, S stripe arrangement, matrix arrangement, delta arrangement, Bayer arrangement, or PenTile arrangement, for example.

Furthermore, examples of a top surface shape of the subpixel are a polygon such as a triangle, a quadrangle (including a rectangle and a square), a pentagon, a hexagon, a polygon with rounded corners, an ellipse, or a circle, for example. Here, the top surface shape of the subpixel corresponds to a top surface shape of a light-emitting region of the light-emitting device or a top surface shape of a light-receiving region of the light-receiving device.

Figure 2A:
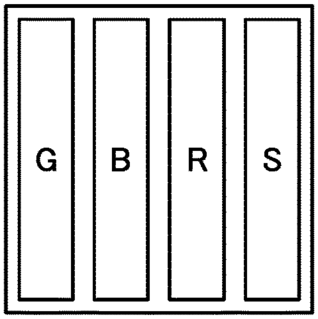
FIG. 2A to FIG. 2I are diagrams illustrating examples of pixels of display apparatuses.
Figure 2B:
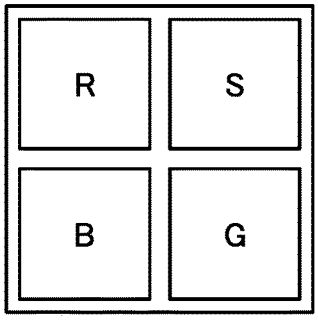
Figure 2C:
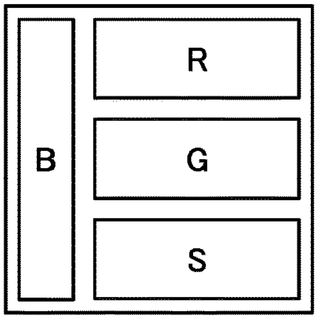

Each of pixels in FIG. 2A to FIG. 2C includes a subpixel G emitting green light, a subpixel B emitting blue light, a subpixel R emitting red light, and a subpixel S including a light-receiving device. There is no particular limitation on the arrangement of the subpixels. Note that in the case where the subpixel S detects light of a specific color, a subpixel that emits light of the color is preferably disposed to be adjacent to the subpixel S, whereby detection accuracy can be increased. Furthermore, a subpixel with a more reliable light-emitting device can be smaller in size.

A pixel illustrated in FIG. 2A employs stripe arrangement. Although FIG. 2A shows an example in which the subpixel R is positioned between the subpixel B and the subpixel S, the subpixel R may be adjacent to the subpixel G, for example.

A pixel illustrated in FIG. 2B employs matrix arrangement. Although FIG. 2B shows an example in which the subpixel R and the subpixel S are positioned in the same row and the subpixel B and the subpixel G are positioned in the same row, the subpixel G or the subpixel B and the subpixel R may be positioned in the same row, for example. Similarly, although FIG. 2B shows an example in which the subpixel R and the subpixel B are positioned in the same column and the subpixel S and the subpixel G are positioned in the same column, the subpixel G or the subpixel S and the subpixel R may be positioned in the same column, for example.

A pixel in FIG. 2C employs a structure in which a fourth subpixel is added to S stripe arrangement. Although FIG. 2C shows an example in which a pixel includes a vertically oriented subpixel B and a horizontally oriented subpixels R, G, and S, a vertically oriented subpixel can be any of the subpixel R, the subpixel G, and the subpixel S and the order of placement of a horizontally oriented subpixels is also not particularly limited.

Figure 2D:
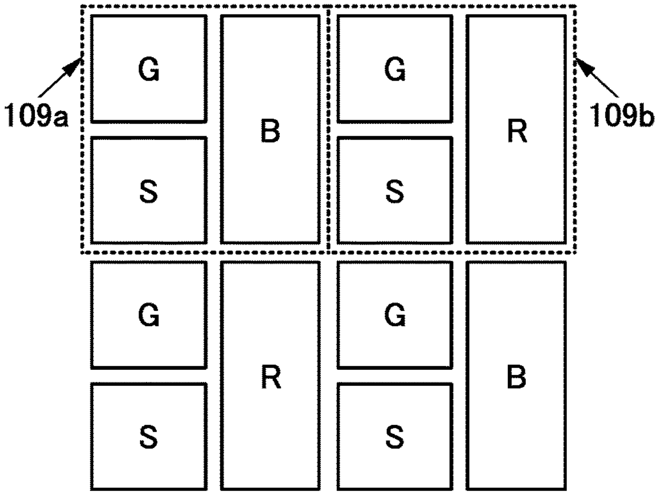

FIG. 2D shows an example in which a pixel 109*a* and a pixel 109*b* are alternately arranged. The pixel 109*a* includes the subpixel B, the subpixel G, and the subpixel S, and the pixel 109*b* includes the subpixel R, the subpixel G, and the subpixel S. FIG. 2D shows an example in which subpixels included in both the pixel 109*a* and the pixel 109*b* are the subpixel G and the subpixel S; however, the subpixels are not limited thereto. The subpixel S is preferably included in both the pixel 109*a* and the pixel 109*b*, whereby the resolution of a captured image can be increased. In this case, light emitted from the subpixel (the subpixel G in FIG. 2D)

included in each of the pixel 109*a* and the pixel 109*b* is preferably detected by the subpixel S.

Figure 2E:
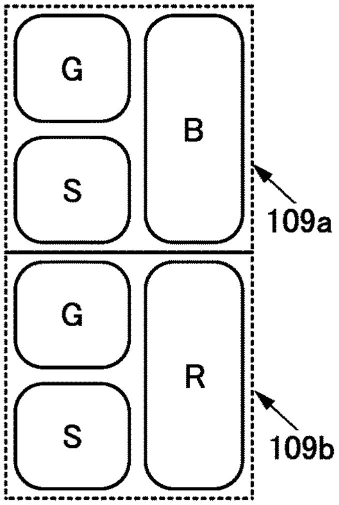

FIG. 2E illustrates a modification example of the subpixels included in the pixel 109*a* and the pixel 109*b* illustrated in FIG. 2D each have a top surface shape of a substantial quadrangle with rounded corners.

Figure 2F:
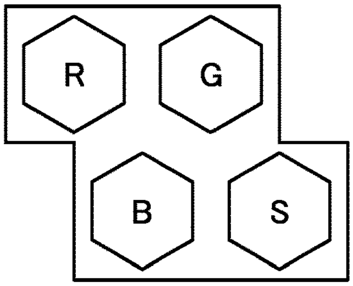

In a pixel layout illustrated in FIG. 2F, two-dimensional hexagonal close-packed arrangement is employed. The hexagonal close-packed arrangement is preferable because the aperture ratio of each subpixel can be increased. FIG. 2F shows an example in which each subpixel has a top surface shape of a hexagon.

Figure 2G:
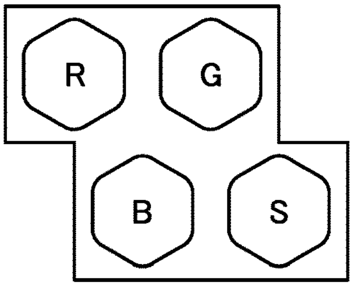

FIG. 2G illustrates a modification example in which the pixels in FIG. 2F each have a top surface shape of a substantial hexagon with rounded corners.

To obtain a desired top surface shape of the EL layer, a technique of correcting a mask pattern in advance so that a transferred pattern agrees with a design pattern (OPC (Optical Proximity Correction) technique) may be used. Specifically, with the OPC technique, a pattern for correction is added to a corner portion or the like of a figure on a mask pattern.

Figure 2H:
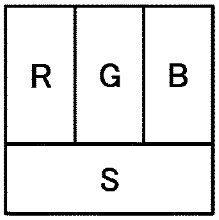

A pixel illustrated in FIG. 2H is an example in which the subpixel R, the subpixel G, and the subpixel B are arranged horizontally in one line and the subpixel S is placed beneath them.

Figure 2I:
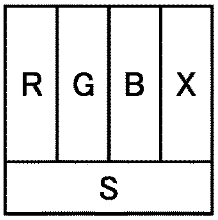

A pixel illustrated in FIG. 2I is an example in which the subpixel R, the subpixel G, the subpixel B, and a subpixel X are arranged horizontally in one line and the subpixel S is placed beneath them.

As the subpixel X, for example, a subpixel that emits infrared light (IR) can be used. Specifically, the subpixel X can employ a structure including a light-emitting device that emits infrared light (IR). In this case, the subpixel S preferably detects infrared light. For example, while an image is displayed using the subpixels R, G, and B, reflected light of the light emitted from the subpixels X as a light source can be detected by the subpixel S.

As the subpixel X, for example, a subpixel emitting white (W) light or a subpixel emitting yellow (Y) light can be used.

As the subpixel X, for example, a structure including the light-receiving device can be employed. In this case, the wavelength ranges of the light detected by the subpixel S and the subpixel X may be the same, different, or partially the same. For example, one of the subpixel S and the subpixel X mainly detects visible light while the other mainly detects infrared light.

[Subpixel S]

For example, image capturing for personal authentication with the use of a fingerprint, a palm print, an iris, the shape of a blood vessel (including the shape of a vein and the shape of an artery), a face, or the like is possible by using the subpixel S.

A smaller light-receiving area of the subpixel S leads to a narrower image-capturing range, inhibits a blur in a captured image, and improves the definition.

The resolution of the subpixel S can be higher than or equal to 100 ppi, preferably higher than or equal to 200 ppi, further preferably higher than or equal to 300 ppi, still further preferably higher than or equal to 400 ppi, and yet further preferably higher than or equal to 500 ppi, and lower than or equal to 2000 ppi, lower than or equal to 1000 ppi, or lower than or equal to 600 ppi, for example. In particular, when light-receiving devices are arranged at a resolution higher than or equal to 200 ppi and lower than or equal to 600 ppi, preferably higher than or equal to 300 ppi and lower than or equal to 600 ppi, the light-receiving devices can be suitably used for image capturing of a fingerprint. The resolution is preferably higher than or equal to 500 ppi, in which case the authentication can conform to the standard by the National Institute of Standards and Technology (NIST) or the like. On the assumption that the resolution at which the light-receiving devices are arranged is 500 ppi, the size of each pixel is 50.8 μm, which is adequate for image capturing of a fingerprint ridge distance (typically, greater than or equal to 300 μm and less than or equal to 500 μm).

In the case where an arrangement interval between the light-receiving devices is smaller than a distance between two projections of a fingerprint, preferably a distance between a depression and a projection adjacent to each other, a clear fingerprint image can be obtained. The distance between a depression and a projection of a fingerprint is said to be approximately 200 μm. In addition, it is said that the human's fingerprint ridge distance is greater than or equal to 300 μm and less than or equal to 500 μm, or 460 μm±150 μm, for example. The arrangement interval between the light-receiving devices can be less than or equal to 400 μm, preferably less than or equal to 200 μm, further preferably less than or equal to 150 μm, still further preferably less than or equal to 100 μm, yet still further preferably less than or equal to 50 μm, and greater than or equal to 1 μm, preferably greater than or equal to 10 μm, further preferably greater than or equal to 20 μm.

The light-receiving device included in the subpixel S preferably detects visible light, and preferably detects one or more of blue light, violet light, bluish violet light, green light, yellowish green light, yellow light, orange light, red light, and the like. The light-receiving device included in the subpixel S may detect infrared light.

The subpixel S can be used in a touch sensor (also referred to as a direct touch sensor), a contactless sensor (also referred to as a hover sensor, a hover touch sensor, a near touch sensor, or a touchless sensor), or the like. The wavelength of light detected by the subpixel S can be determined depending on the application purpose. For example, when the subpixel S can detect infrared light, touch detection is possible even in a dark place.

Here, the touch sensor or the contactless touch sensor can detect an approach or contact of an object (e.g., a finger, a hand, or a pen). The touch sensor can detect an object when an electronic device including the display apparatus of one embodiment of the present invention and the object come in direct contact with each other. Alternatively, the contactless sensor can detect an object even when the object is not in contact with the electronic device. For example, the display apparatus (or the electronic device) is preferably capable of detecting an object positioned in the range of 0.1 mm to 300 mm inclusive, more preferably 3 mm to 50 mm inclusive from the display apparatus. This structure enables the electronic device to be operated without direct contact of the object. In other words, the display apparatus can be operated in a contactless (touchless) manner. With the above-described structure, the electronic device can have a reduced risk of being dirty or damaged, or can be operated without direct contact of an object with stain (e.g., dust or virus) attached on the electronic device.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of the touch sensor or the contactless sensor may be changed in accordance with the refresh rate. In the case where the refresh rate of the display apparatus is 120 Hz, for example, the drive frequency of the touch sensor or the contactless sensor can be higher than 120 Hz (typically 240 Hz). With this structure, low power consumption can be achieved, and the response speed of the touch sensor or the contactless sensor can be increased.

Structure Example 2 of Display Apparatus

The detailed structures of the light-emitting device and the light-receiving device included in the display apparatus of one embodiment of the present invention will be described below with reference to FIG. 3 and FIG. 4.

The display apparatus of one embodiment of the present invention can have any of the following structures: a top-emission structure in which light is emitted in a direction opposite to a substrate where the light-emitting device is formed, a bottom-emission structure in which light is emitted toward the substrate where the light-emitting device is formed, and a dual-emission structure in which light is emitted toward both surfaces.

Figure 3:
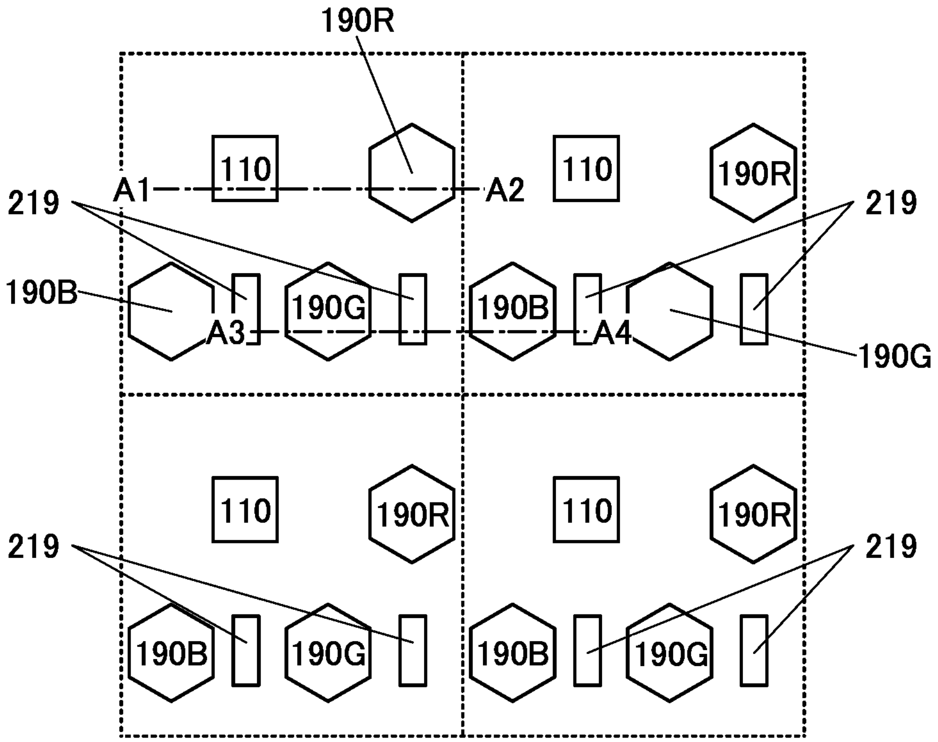
FIG. 3 is a top view illustrating an example of a display apparatus.

FIG. 3 and FIG. 4 illustrate a top-emission display apparatus as an example.

Although this embodiment mainly describes a display apparatus including a light-emitting device that emits visible light and a light-receiving device that detects visible light, the display apparatus may also include a light-emitting device that emits infrared light. The light-receiving device may have a function of detecting infrared light or a function of detecting both visible light and infrared light.

FIG. 3 illustrates a top view of the display apparatus of one embodiment of the present invention.

In FIG. 3, a portion surrounded by a dotted frame corresponds to one pixel. One pixel includes a light-receiving device 110, a red light-emitting device 190R, a green light-emitting device 190G, and a blue light-emitting device 190B.

There is no particular limitation on top surface shapes of the light-receiving device 110 and the light-emitting devices 190R, 190G, and 190B. A pixel layout illustrated in FIG. 3 employs a hexagonal close-packed arrangement. The hexagonal close-packed arrangement is preferable because the aperture ratios of the light-receiving device 110 and the light-emitting devices 190R, 190G, and 190B can be increased. In a top view, a light-emitting region of the light-receiving device 110 is quadrilateral, and a light-receiving region of each of the light-emitting devices 190R, 190G, and 190B is hexagonal.

In a top view (also referred to as a plan view), a spacer 219 is provided between the green light-emitting device 190G and the blue light-emitting device 190B. The position where the spacer 219 is provided and the number of the spacers 219 can be determined as appropriate.

<Display Apparatus 10A>

Figure 4A:
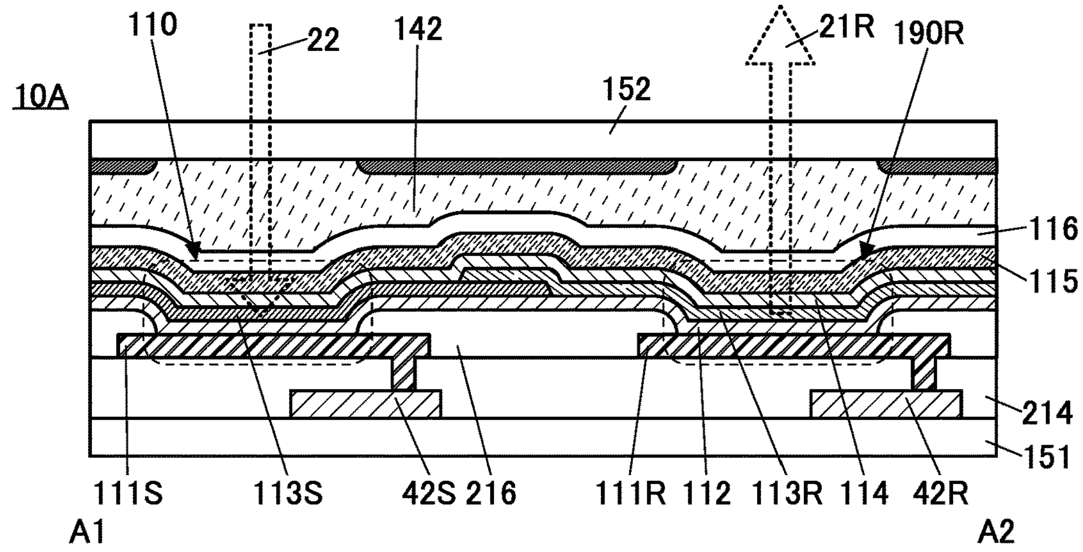
FIG. 4A to FIG. 4C are cross-sectional views illustrating examples of display apparatuses.
Figure 4B:
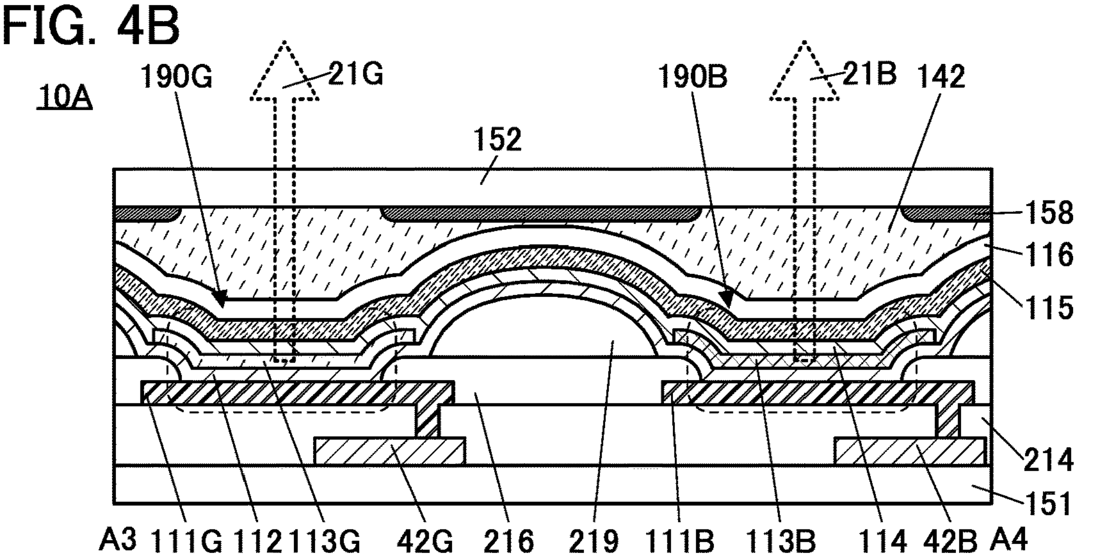

FIG. 4A shows an example of a cross-sectional view taken along a dashed-dotted line A1-A2 in FIG. 3, and FIG. 4B shows an example of a cross-sectional view taken along a dashed-dotted line A3-A4 in FIG. 3.

As illustrated in FIG. 4A and FIG. 4B, the display apparatus 10A includes the light-receiving device 110, the red light-emitting device 190R, the green light-emitting device 190G, and the blue light-emitting device 190B.

The light-emitting device 190R includes a pixel electrode 111R, a common layer 112, a light-emitting layer 113R, a common layer 114, and a common electrode 115. The light-emitting layer 113R contains an organic compound that emits red light 21R. In this embodiment, the case where the pixel electrode 111R functions as an anode and the common electrode 115 functions as a cathode is described as an example.

The light-emitting device 190R has a function of emitting red light. Specifically, the light-emitting device 190R is an electroluminescent device that emits light (see red light 21R) to a substrate 152 side by applying voltage between the pixel electrode 111R and the common electrode 115.

The light-emitting device 190G includes a pixel electrode 111G, the common layer 112, a light-emitting layer 113G, the common layer 114, and the common electrode 115. The light-emitting layer 113G contains an organic compound that emits green light 21G. The light-emitting device 190G has a function of emitting the green light 21G.

The light-emitting device 190B includes a pixel electrode 111B, the common layer 112, a light-emitting layer 113B, the common layer 114, and the common electrode 115. The light-emitting layer 113B contains an organic compound that emits blue light 21B. The light-emitting device 190B has a function of emitting blue light 21B.

The light-receiving device 110 includes a pixel electrode 111S, the common layer 112, an active layer 113S, the common layer 114, and the common electrode 115. The active layer 113S contains an organic compound. The light-receiving device 110 has a function of detecting visible light. The description in this embodiment is made so that the pixel electrode 111S functions as an anode and the common electrode 115 functions as a cathode like the above light-emitting device. The light-receiving device 110 is driven by application of reverse bias between the pixel electrode 111S and the common electrode 115, so that light entering the light-receiving device 110 can be detected and electric charge can be generated and extracted as current in the display apparatus 10A.

The light-receiving device 110 has a function of detecting light. Specifically, the light-receiving device 110 is a photoelectric conversion device that receives light 22 incident from the outside of a display apparatus 10B and converts the light 22 into an electric signal. The light 22 can also be expressed as light that is emitted by the light-emitting device and then reflected by an object. The light 22 may enter the light-receiving device 110 through a lens.

The pixel electrodes 111S, 111R, 111G, 111B, the common layer 112, the active layer 113S, the light-emitting layers 113R, 113G, 113B, the common layer 114, and the common electrode 115 may each have a single-layer structure or a stacked-layer structure.

The common layer 112 can include at least one of a hole-injection layer, a hole-transport layer, and an electron-blocking layer. A function of the common layer 112 in the light-emitting device is different from its function in the light-receiving device 110 in some cases. For example, when the common layer 112 includes a hole-injection layer, the hole-injection layer functions as a hole-injection layer in the light-emitting device and functions as a hole-transport layer in the light-receiving device 110.

The common layer 114 can include at least one of an electron-injection layer, an electron-transport layer, and a hole-blocking layer. A function of the common layer 114 in the light-emitting device is different from its function in the light-receiving device 110 in some cases. For example, when the common layer 114 includes an electron-injection layer, the electron-injection layer functions as an electron-injection layer in the light-emitting device and functions as an electron-transport layer in the light-receiving device 110.

In the display apparatus of this embodiment, an organic compound is used for the active layer 113S of the light-receiving device 110. In the light-receiving device 110, the layers other than the active layer 113S can have structures in common with the layers in the light-emitting device (EL device). Therefore, the light-receiving device 110 can be formed concurrently with formation of a light-emitting device only by adding a step of forming the active layer 113S in the manufacturing process of the light-emitting device. The light-emitting device and the light-receiving device 110 can be formed over one substrate. Accordingly, the light-receiving device 110 can be incorporated in the display apparatus without a significant increase in the number of manufacturing steps.

The display apparatus 10A illustrates an example in which the light-receiving device 110 and the light-emitting devices 190R, 190G, and 190B have a common structure except that the active layer 113S of the light-receiving device 110 and the light-emitting layers of the light-emitting devices 190R, 190G, and 190B (light-emitting layers 113R, 113G, and 113B) are separately formed. Note that the structures of the light-receiving device 110 and the light-emitting devices 190R, 190G, and 190B are not limited thereto. The light-receiving device 110 and the light-emitting devices 190R, 190G, and 190B may each include layers separately formed in addition to the active layer 113S and the light-emitting layers (light-emitting layers 113R, 113G, and 113B). The light-receiving device 110 and the light-emitting devices 190R, 190G, and 190B preferably include one or more shared layers (common layer(s)). Thus, the light-receiving device 110 can be incorporated in the display apparatus without a significant increase in the number of manufacturing steps.

In the display apparatus 10A, the light-receiving device 110, the light-emitting device 190R, the light-emitting device 190G, the light-emitting device 190B, a transistor 42S, a transistor 42R, a transistor 42G, a transistor 42B, and the like are provided between a pair of substrates (a substrate 151 and the substrate 152).

The pixel electrodes 111S, 111R, 111G, and 111B are positioned over an insulating layer 214. The pixel electrodes 111S, 111R, 111G, and 111B can be formed using the same material and in the same process. Accordingly, the manufacturing cost of the display apparatus can be reduced and the manufacturing process of the display apparatus can be simplified.

End portions of the pixel electrodes 111S, 111R, 111G, and 111B are covered with a partition 216. The pixel electrodes 111S, 111R, 111G, and 111B are electrically insulated (also referred to as being electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 may be either a layer transmitting visible light or a layer blocking visible light. For example, with the use of a resin material containing a pigment or dye, or a brown resist material, a partition blocking visible light (being colored) may be formed.

The pixel electrode 111S is electrically connected to a source or a drain of the transistor 42S through an opening provided in the insulating layer 214. The pixel electrode 111R is electrically connected to a source or a drain of the transistor 42R through the opening provided in the insulating layer 214. Similarly, the pixel electrode 111G is electrically connected to a source or a drain of the transistor 42G through the opening provided in the insulating layer 214. The pixel electrode 111B is electrically connected to a source or a drain of the transistor 42B through the opening provided in the insulating layer 214.

The transistors 42R, 42G, 42B, and 42S are over and in contact with the same layer (the substrate 151 in FIG. 4A and FIG. 4B).

At least part of a circuit electrically connected to the light-receiving device 110 and a circuit electrically connected to the light-emitting device are preferably formed using the same material in the same process. In that case, the thickness of the display apparatus can be reduced compared with the case where the two circuits are separately formed, resulting in simplification of the manufacturing processes.

The light-receiving device 110 and the light-emitting devices 190R, 190G, and 190B are preferably covered with a protective layer 116. In FIG. 4A and FIG. 4B, the protective layer 116 is provided on and in contact with the common electrode 115. Providing the protective layer 116 can inhibit entry of impurities such as water into the light-receiving device 110 and the light-emitting devices 190R, 190G, and 190B so that the reliability of the light-receiving device 110 and the light-emitting devices 190R, 190G, and 190B can be increased. The protective layer 116 and the substrate 152 are attached to each other with an adhesive layer 142.

A light-shielding layer 158 is provided on a surface of the substrate 152 on the substrate 151 side. The light-shielding layer 158 has openings at positions overlapping with the light-emitting devices 190R, 190G, and 190B and at a position overlapping with the light-receiving device 110. Note that in this specification and the like, the position overlapping with the light-emitting device refers specifically to a position overlapping with a light-emitting region of the light-emitting device. Similarly, the position overlapping with the light-receiving device 110 refers specifically to a position overlapping with a light-receiving region of the light-receiving device 110.

In the display apparatus of one embodiment of the present invention, light emitted from the light-emitting device is extracted through a display surface, and light with which the light-receiving device is irradiated passes through the display surface. Light emitted from the light-emitting device is preferably extracted to the outside of the display apparatus through the opening in the light-shielding layer 158 (or a region where the light-shielding layer is not provided), and the light-receiving device is preferably irradiated with light passing through the opening in the light-shielding layer 158 (or a region where the light-shielding layer is not provided).

The light-receiving device 110 detects light that is emitted from the light-emitting device and then reflected by an object. However, in some cases, light emitted from the light-emitting device is reflected inside the display apparatus and enters the light-receiving device 110 as stray light without via the object. Such stray light ends up as noise in light detection, which is a factor reducing an S/N ratio (signal-to-noise ratio). Provision of the light-shielding layer 158 can reduce the influence of stray light. Consequently, noise can be reduced, and the sensitivity of a sensor using the light-receiving device 110 can be increased.

For the light-shielding layer 158, a material that blocks light emitted from the light-emitting device can be used. The light-shielding layer 158 preferably absorbs visible light. As the light-shielding layer 158, a black matrix can be formed using a metal material or a resin material containing pigment (e.g., carbon black) or dye, for example. The light-shielding layer 158 may have a stacked-layer structure of a red color filter, a green color filter, and a blue color filter.

The spacer 219 is positioned over the partition 216, and is positioned between the light-emitting device 190G and the light-emitting device 190B in a top view.

As illustrated in FIG. 4A, in the display apparatus 10A, the active layer 113S and the light-emitting layer 113R are stacked over the partition 216 in this order. Note that although FIG. 4A illustrates a structure where the light-emitting layer 113R is provided over the active layer 113S, one embodiment of the present invention is not limited thereto. For example, the active layer 113S may be provided over the light-emitting layer 113R.

In the manufacture process of the display apparatus, the spacer 219 comes in direct contact with a metal mask in some cases. In this case, as illustrated in FIG. 4B, the light-emitting layer 113G and the light-emitting layer 113B are not formed over the spacer 219.

<Display Apparatus 10B>

Figure 4C:
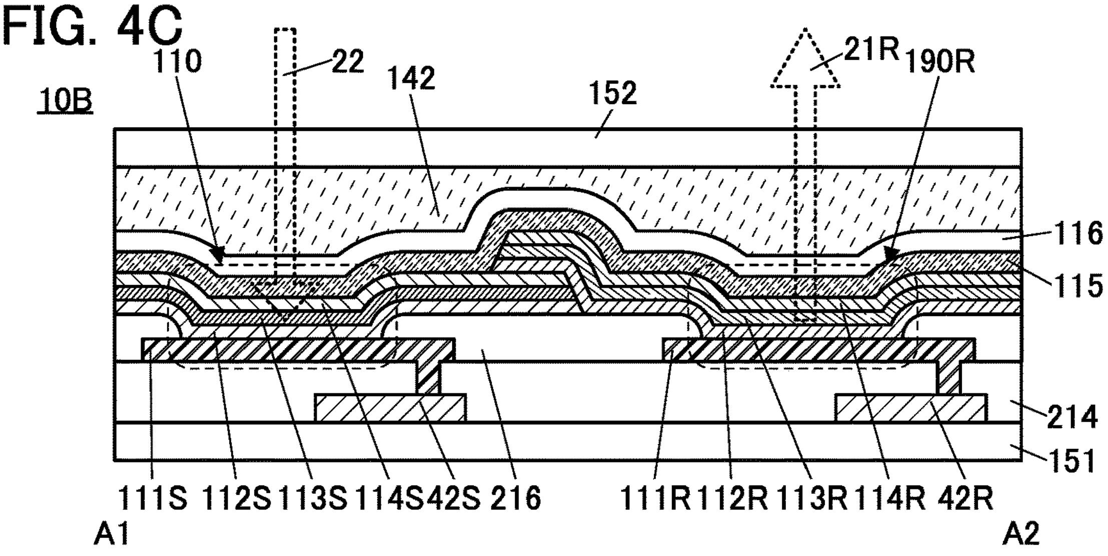

FIG. 4C is an example of a cross-sectional view taken along the dashed-dotted line A1-A2 in FIG. 3. Note that in the description of the display apparatus below, components similar to those of the above-mentioned display apparatus are not described in some cases.

The display apparatus 10B includes the light-receiving device 110, the light-emitting device 190R, the transistor 42S, the transistor 42R, and the like between the pair of substrates (the substrate 151 and the substrate 152).

The light-emitting device 190R includes the pixel electrode 111R, a functional layer 112R, the light-emitting layer 113R, a functional layer 114R, and the common electrode 115. The light-emitting layer 113R contains an organic compound that emits red light 21R. The light-emitting device 190R has a function of emitting red light.

The light-receiving device 110 includes the pixel electrode 111S, a functional layer 112S, the active layer 113S, a functional layer 114S, and the common electrode 115. The active layer 113S contains an organic compound. The light-receiving device 110 has a function of detecting visible light.

The functional layers 112R, 112S, 114R, and 114S may each have a single-layer structure or a stacked-layer structure.

The functional layer 112S is positioned over the pixel electrode 111S. The active layer 113S overlaps with the pixel electrode 111S with the functional layer 112S therebetween. The functional layer 114S is positioned over the active layer 113S. The active layer 113S overlaps with the common electrode 115 with the functional layer 114S therebetween. The functional layer 112S can include a hole-transport layer. The functional layer 114S can include an electron-transport layer.

The functional layer 112R is positioned over the pixel electrode 111R. The light-emitting layer 113R overlaps with the pixel electrode 111R with the functional layer 112R therebetween. The functional layer 114R is positioned over the light-emitting layer 113R. The light-emitting layer 113R overlaps with the common electrode 115 with the functional layer 114R therebetween. The functional layer 112R can include at least one of a hole-injection layer, a hole-transport layer, and an electron-blocking layer. The functional layer 114R can include at least one of an electron-injection layer, an electron-transport layer, and a hole-blocking layer.

The common electrode 115 is a layer shared by the light-receiving device 110 and the light-emitting device 190R.

In the light-receiving device 110, the functional layer 112S, the active layer 113S, and the functional layer 114S, which are positioned between the pixel electrode 111S and the common electrode 115, can each be referred to as an organic layer (layer containing an organic compound). The pixel electrode 111S preferably has a function of reflecting visible light. The common electrode 115 has a function of transmitting visible light. Note that in the case where the light-receiving device 110 is configured to detect infrared light, the common electrode 115 has a function of transmitting infrared light. Furthermore, the pixel electrode 111S preferably has a function of reflecting infrared light.

In the light-emitting device 190R, the functional layer 112R, the light-emitting layer 113R, and the functional layer 114R, which are positioned between the pixel electrode 111R and the common electrode 115, can each be referred to as an EL layer. The pixel electrode 111R preferably has a function of reflecting visible light. The common electrode 115 has a function of transmitting visible light.

The light-emitting device included in the display apparatus of this embodiment preferably employs a micro optical resonator (microcavity) structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a reflective electrode and an electrode having a property of transmitting visible light (also referred to as a transparent electrode). In this specification and the like, the reflective electrode functioning as part of a transflective electrode may be referred to as a pixel electrode or a common electrode, and the transparent electrode may be referred to as an optical adjustment layer; however, in some cases, the transparent electrode (optical adjustment layer) can also be regarded as having a function of a pixel electrode or a common electrode.

The transparent electrode has a light transmittance of higher than or equal to 40%. For example, the light-emitting device preferably includes an electrode having a visible light (light at wavelengths greater than or equal to 400 nm and less than 750 nm) transmittance of higher than or equal to 40%. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ (2 cm or lower. Note that in the case where a light-emitting device that emits near-infrared light is used in the display apparatus, the near-infrared light (light at wavelengths greater than or equal to 750 nm to less than or equal to 1300 nm) transmittance and reflectivity of these electrodes are preferably in the above ranges.

At least one of the functional layers 112R, 112S, 114R, and 114S may function as an optical adjustment layer. By changing the thicknesses of the functional layers of light-emitting devices of respective colors, light of a specific color can be intensified and taken out from each light-emitting device. Note that when the transflective electrode has a stacked-layer structure of a reflective electrode and a transparent electrode, the optical distance between the pair of electrodes represents the optical distance between a pair of reflective electrodes.

In the display apparatus 10B, the functional layer 112S, the active layer 113S, the functional layer 114S, the functional layer 112R, the light-emitting layer 113R, and the functional layer 114R are stacked in this order over the partition 216. Note that the stacking order of these layers is not particularly limited. For example, the functional layer 112S, the functional layer 112R, the active layer 113S, the light-emitting layer 113R, the functional layer 114S, and the functional layer 114R may be stacked in this order. The active layer 113S may be provided over the light-emitting layer 113R.

Example of Method for Manufacturing Display Apparatus

Figures 5A, 5B, 5C:
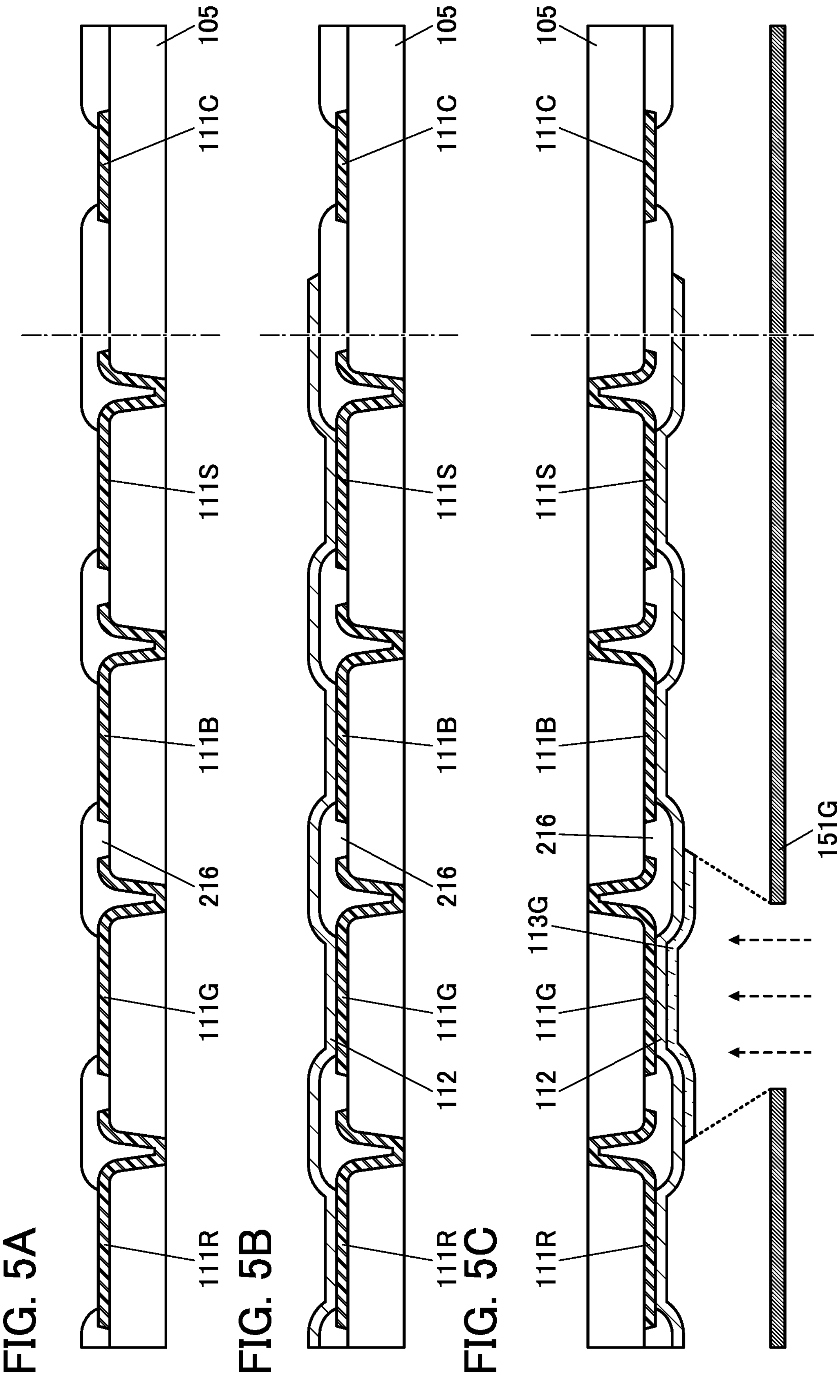
FIG. 5A to FIG. 5C are cross-sectional views illustrating an example of a method for manufacturing a display apparatus.

Next, an example of a method for manufacturing a display apparatus is described with reference to FIG. 5 to FIG. 7. In FIG. 5A to FIG. 7B, the manufacturing method of the structure including a connection portion of the light-emitting devices 190R, 190G, 190B, the light-receiving device 110, and the common electrode 115 and a conductive layer is mainly described.

Thin films (e.g., an insulating film, a semiconductor film, and a conductive film) included in the display apparatus can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. In addition, an example of a thermal CVD method is a metal organic chemical vapor deposition (MOCVD: Metal Organic CVD) method.

Alternatively, thin films (e.g., an insulating film, a semiconductor film, and a conductive film) included in the display apparatus can be formed by a method such as spin coating, dipping, spray coating, ink-jetting, dispensing, screen printing, offset printing, a doctor knife method, slit coating, roll coating, curtain coating, or knife coating.

Specifically, for manufacturing the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a CVD method. Specifically, functional layers (e.g., a hole-injection layer, a hole-transport layer, a light-emitting layer, an electron-transport layer, and an electron-injection layer) included in EL layers can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

Thin films included in the display apparatus can be processed by a photolithography method or the like. Alternatively, thin films may be processed by a nanoimprinting method, a sandblasting method, a lift-off method, or the like. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As the light used for light exposure in the photolithography method, for example, an i-line (a wavelength of 365 nm), a g-line (a wavelength of 436 nm), an h-line (a wavelength of 405 nm), or combined light of any of them can be used. Alternatively, ultraviolet light, KrF laser light, ArF laser light, or the like can be used. In addition, light exposure may be performed by liquid immersion exposure technique. As the light used for light exposure, extreme ultraviolet light or X-rays may also be used. Furthermore, instead of the light used for light exposure, an electron beam can also be used. It is preferable to use extreme ultraviolet light, X-rays, or an electron beam because they can perform extremely minute processing. Note that a photomask is not needed when light exposure is performed by scanning with a beam such as an electron beam.

For etching of thin films, a dry etching method, a wet etching method, a sandblast method, or the like can be used.

First, a substrate is prepared. As the substrate, a substrate having at least heat resistance high enough to withstand heat treatment performed later can be used. In the case where an insulating substrate is used as the substrate, a glass substrate, a quartz substrate, a sapphire substrate, a ceramics substrate, an organic resin substrate, or the like can be used. Alternatively, a single crystal semiconductor substrate or a polycrystalline semiconductor substrate using silicon, silicon carbide, or the like, a compound semiconductor substrate of silicon germanium or the like, a semiconductor substrate such as an SOI substrate, or the like can be used.

As the substrate, it is particularly preferable to use the semiconductor substrate or the insulating substrate where a semiconductor circuit including a semiconductor element such as a transistor is formed. The semiconductor circuit preferably forms a pixel circuit, a gate line driver circuit (gate driver), a source line driver circuit (source driver), or the like. In addition to the above, an arithmetic circuit, a memory circuit, or the like may be formed.

An insulating layer 105 is provided over the uppermost portion of the substrate. The insulating layer 105 includes a plurality of openings reaching a transistor, a wiring, an electrode, or the like provided in the substrate. The openings can be formed by a photolithography method.

For the insulating layer 105, an inorganic insulating material or an organic insulating material can be used.

Then, a conductive film is deposited over the insulating layer 105. For deposition of the conductive film, a sputtering method or a vacuum evaporation method can be used, for example. Then, the conductive film is processed to form the pixel electrodes 111R, 111G, 111B, 111S and a conductive layer 111C over the insulating layer 105 (FIG. 5A). Specifically, a resist mask is formed over the conductive film by a photolithography method, and an unnecessary portion of the conductive film is removed by etching. After that, the resist mask is removed, whereby the pixel electrodes 111R, 111G, 111B, 111S and the conductive layer 111C can be formed in the same process.

Next, the partition 216 that covers end portions of the pixel electrodes 111R, 111G, 111B, 111S, and the conductive layer 111C is formed (FIG. 5A).

The partition 216 can have a single-layer structure or a stacked-layer structure including one or both of an inorganic insulating film and an organic insulating film.

Next, the common layer 112 is formed over the pixel electrodes 111R, 111G, 111B, and 111S (FIG. 5B).

The common layer 112 is preferably formed not to overlap with the conductive layer 111C as illustrated in FIG. 5B. For example, by using a mask for specifying a film formation area (also referred to as an area mask, a rough metal mask, or the like to be distinguished from a fine metal mask), the formation range of the common layer 112 can be controlled.

The common layer 112 is preferably formed by a vacuum evaporation method. Note that the formation method is not limited to the above and the common layer 112 can be formed by a sputtering method, a transfer method, a printing method, a coating method, an ink-jet method, or the like.

Next, the island-shaped light-emitting layer 113G is formed over the common layer 112 so as to include a region overlapping with the pixel electrode 111G.

The light-emitting layer 113G is preferably formed by a vacuum evaporation method using a fine metal mask (FMM). Note that the island-shaped light-emitting layer 113G may be formed by a sputtering method using an FMM or an inkjet method.

FIG. 5C illustrates a state in which the light-emitting layer 113G is formed through an FMM 151G. FIG. 5C illustrates film formation performed in a state where the substrate is inverted so that the film formation surface faces downward, i.e., film formation performed with a face-down system.

In an evaporation method or the like using a FMM, an area wider than an opening pattern of the FMM is subjected to evaporation in many cases. Thus, as indicated by a dashed line in FIG. 5C, the light-emitting layer 113G can be formed in a wider range as compared with the opening pattern of the FMM 151G.

Figure 6A:
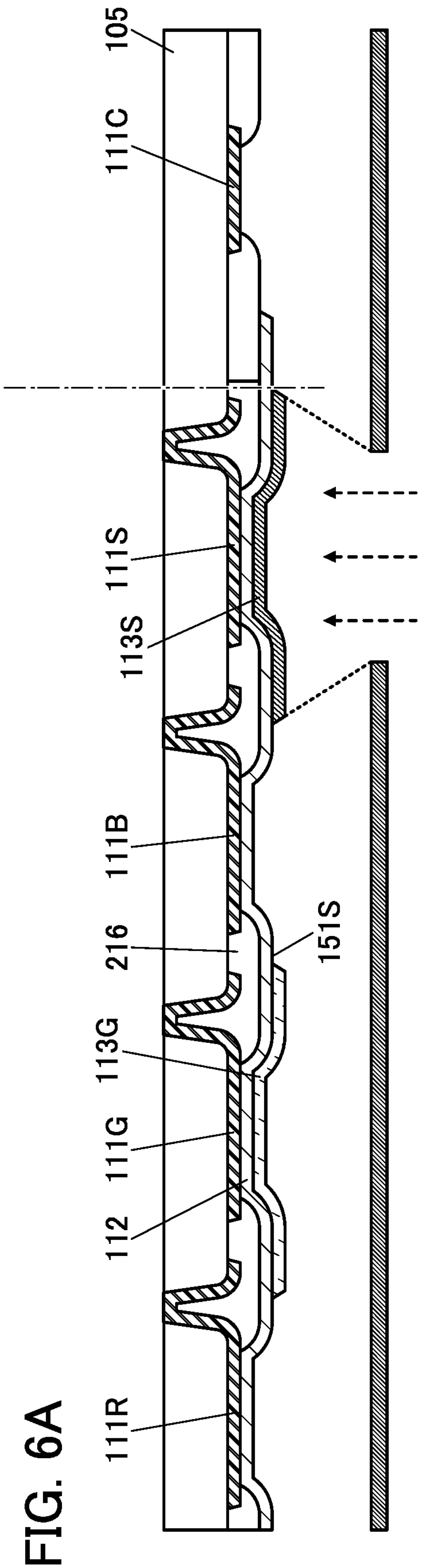
FIG. 6A and FIG. 6B are cross-sectional views illustrating an example of a method for manufacturing a display apparatus.

Next, with an FMM 151S, the island-shaped active layer 113S is formed over the common layer 112 so as to include a region overlapping with the pixel electrode 111S (FIG. 6A). As the active layer 113S, a pattern which extends beyond the pixel electrode 111S is formed as in the case of the light-emitting layer 113G.

Figure 6B:
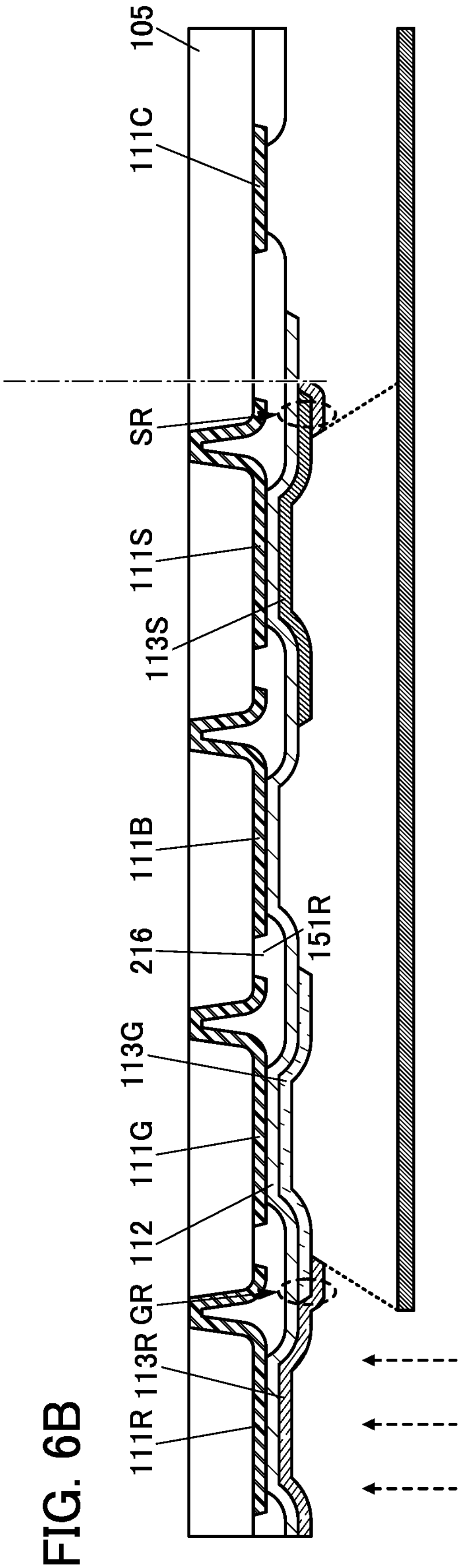

Next, with an FMM 151R, the island-shaped light-emitting layer 113R is formed over the common layer 112 so as to include a region overlapping with the pixel electrode 111R (FIG. 6B).

As the light-emitting layer 113R, a pattern which extends beyond the pixel electrode 111R is formed as in the case of the light-emitting layer 113G. As a result, a portion where the light-emitting layer 113R overlaps with the active layer 113S is formed as illustrated in a region SR in FIG. 6B. In addition, a portion where the light-emitting layer 113R overlaps with the light-emitting layer 113G is formed as illustrated in a region GR in FIG. 6B.

Figure 7A:
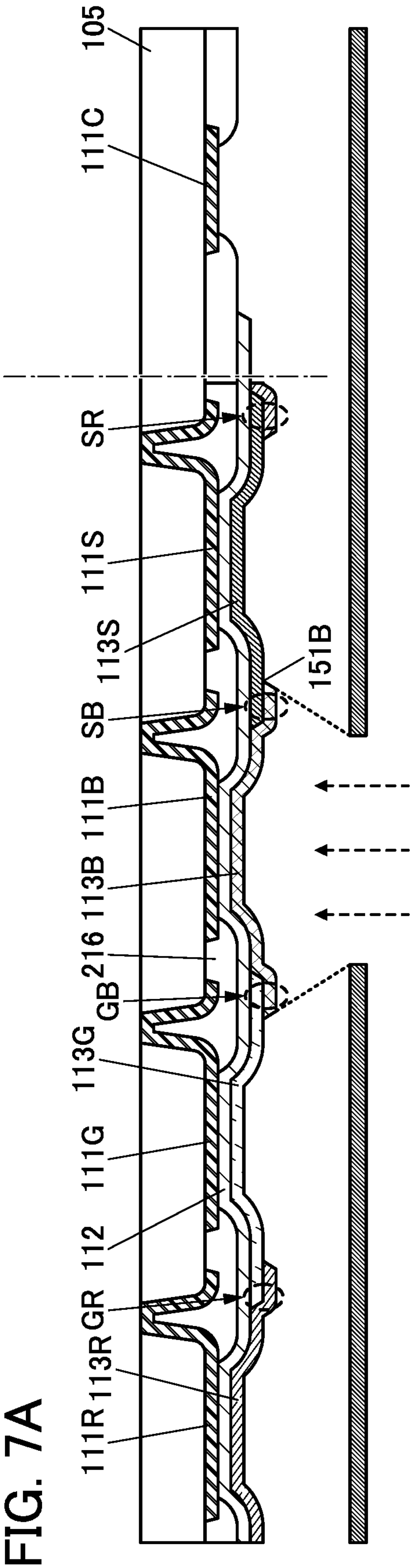
FIG. 7A and FIG. 7B are cross-sectional views illustrating an example of a method for manufacturing a display apparatus.
Figure 7B:
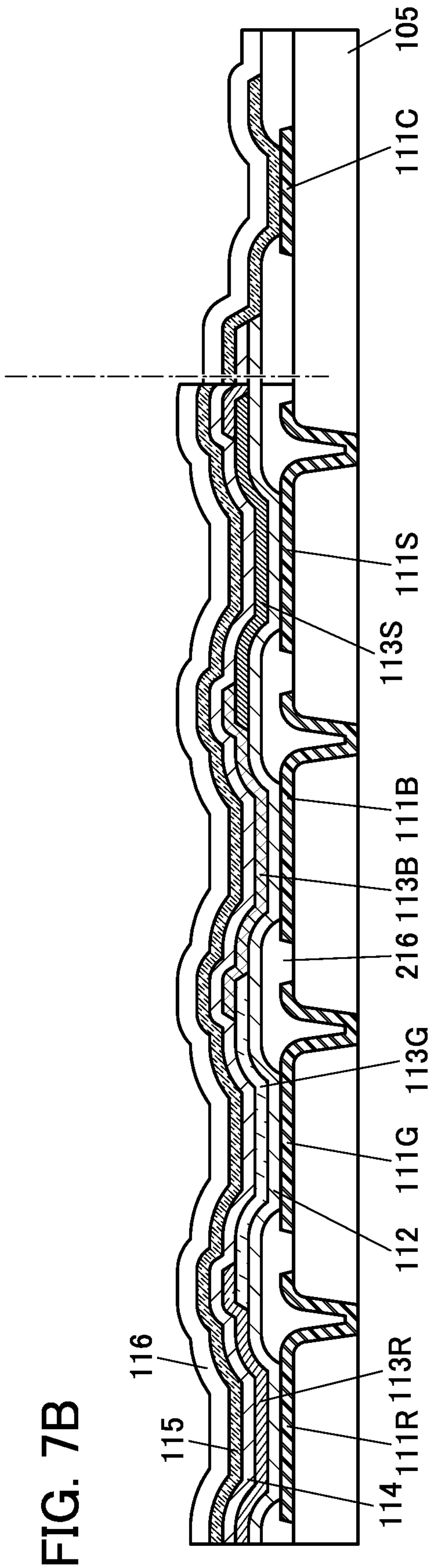

Next, with an FMM 151B, the island-shaped light-emitting layer 113B is formed over the common layer 112 so as to include a region overlapping with the pixel electrode 111B (FIG. 7A).

As the light-emitting layer 113B, a pattern which extends beyond the pixel electrode 111B is formed as in the case of the light-emitting layer 113G. As a result, a portion where the light-emitting layer 113B overlaps with the active layer 113S is formed as illustrated in a region SB in FIG. 7A. In addition, a portion where the light-emitting layer 113B overlaps with the light-emitting layer 113G is formed as illustrated in a region GB in FIG. 7A.

Note that the formation order of the light-emitting layers 113R, 113G, 113B and the active layer 113S is not particularly limited. In the case where direct contact between any two layers out of the light-emitting layers 113R, 113G, and 113B might cause side leakage, it is preferable to form one of the two layers, form the active layer 113S, and then form the other of the two layers. This can decrease a region where the two layers are in contact with each other and inhibit generation of side leakage.

Next, the common layer 114 is formed over the light-emitting layers 113R, 113G, 113B and the active layer 113S (FIG. 7B).

As illustrated in FIG. 7B, the common layer 114 is preferably formed not to overlap with the conductive layer 111C. For example, by using a mask for specifying a film formation area, the formation range of the common layer 114 can be controlled.

The common layer 114 can be preferably formed by a vacuum evaporation method. Without limitation to this, a sputtering method, a transfer method, a printing method, a coating method, an ink-jet method, or the like can be used for the formation.

Next, the common electrode 115 is formed over the common layer 114 (FIG. 7B).

For formation of the common electrode 115, a sputtering method or a vacuum evaporation method can be used, for example. Alternatively, a film formed by an evaporation method and a film formed by a sputtering method may be stacked.

Note that a mask for specifying a film formation area may be used in the formation of the common electrode 115.

After that, the protective layer 116 is formed over the common electrode 115 (FIG. 7B). Furthermore, the substrate 152 is attached over the protective layer 116 with the adhesive layer 142, whereby the display apparatus of this embodiment can be manufactured.

Examples of methods for forming the protective layer 116 include a vacuum evaporation method, a sputtering method, a CVD method, and an ALD method. The protective layer 116 may be formed by stacking films formed by different deposition methods.

Structure Example 3 of Display Apparatus

A more detailed structure of the display apparatus of one embodiment of the present invention is described below with reference to FIG. 8 to FIG. 11B.

<Display Apparatus 100A>

Figure 8:
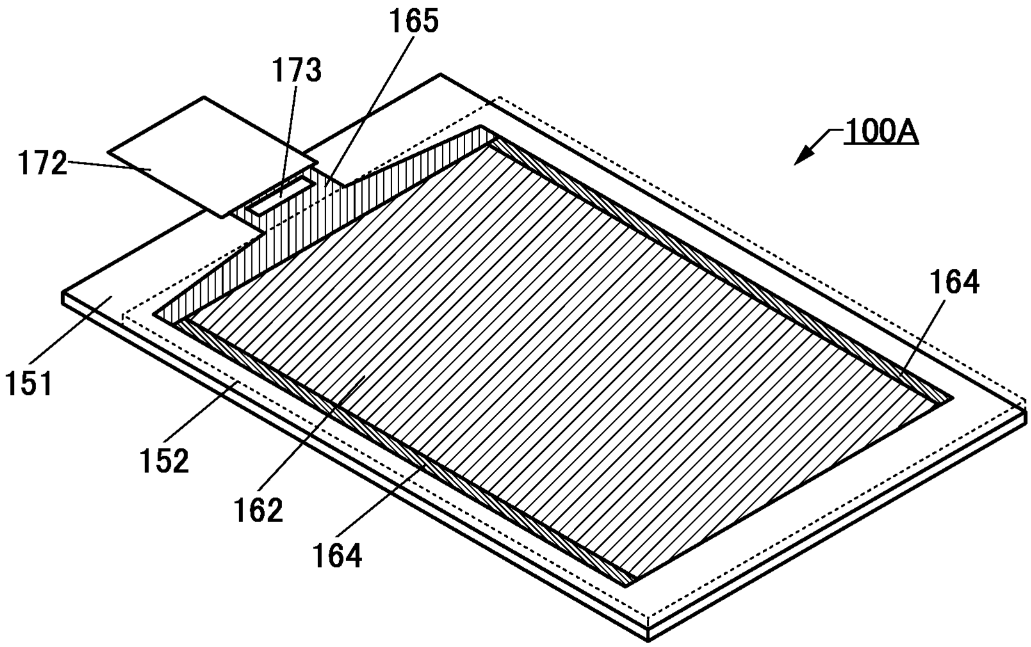
FIG. 8 is a perspective view illustrating an example of a display apparatus.
Figure 9:
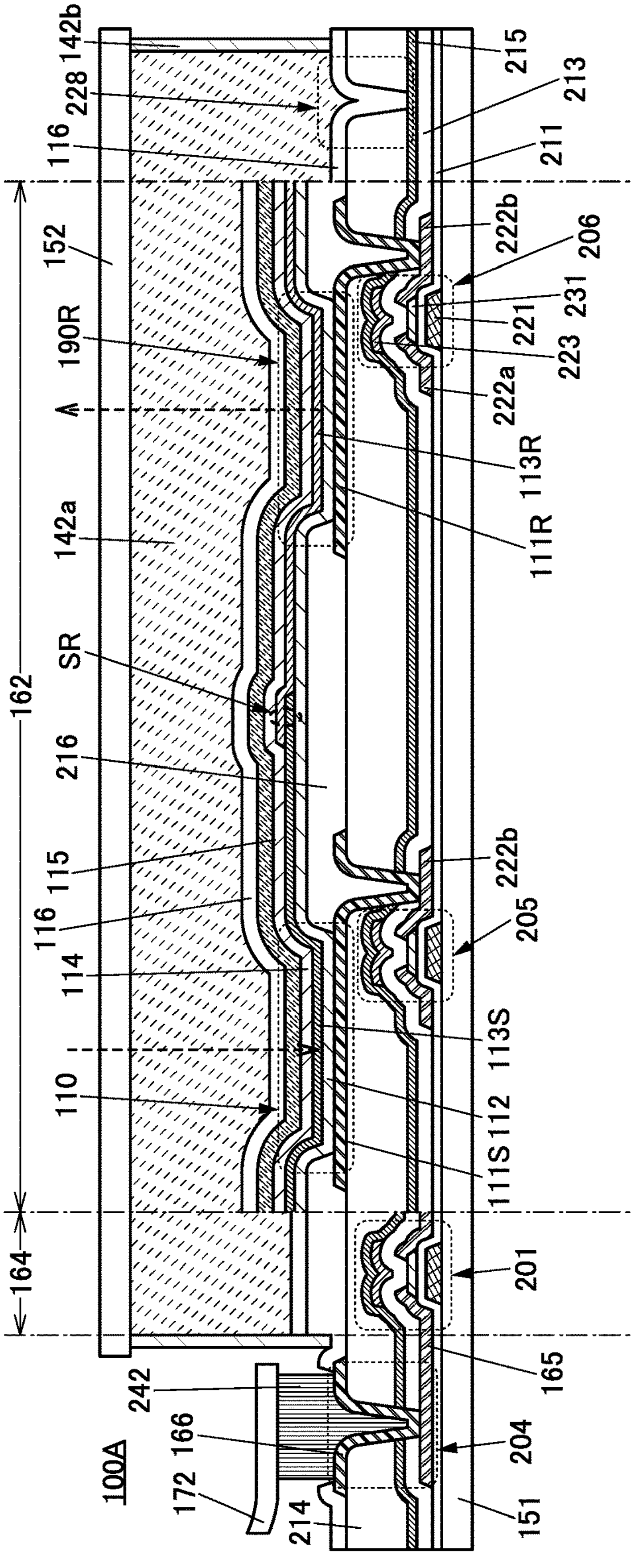
FIG. 9 is a cross-sectional view illustrating an example of a display apparatus.

FIG. 8 is a perspective view of a display apparatus 100A, and FIG. 9 is a cross-sectional view of the display apparatus 100A.

The display apparatus 100A has a structure where the substrate 152 and the substrate 151 are attached to each other. In FIG. 8, the substrate 152 is denoted by a dashed line.

The display apparatus 100A includes a display portion 162, a circuit 164, a wiring 165, and the like. FIG. 8 illustrates an example in which the display apparatus 100A is provided with an IC (integrated circuit) 173 and an FPC 172. Thus, the structure illustrated in FIG. 8 can be regarded as a display module including the display apparatus 100A, the IC, and the FPC.

As the circuit 164, a scan line driver circuit can be used, for example.

The wiring 165 has a function of supplying a signal and power to the display portion 162 and the circuit 164. The signal and the power are input to the wiring 165 from the outside through the FPC 172 or input to the wiring 165 from the IC 173.

FIG. 8 illustrates an example where the IC 173 is provided on the substrate 151 by a COG method, a COF method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 9 illustrates an example of a cross section including part of a region including the FPC 172, part of the circuit 164, part of the display portion 162, and part of a region including an end portion in the display apparatus 100A.

The display apparatus 100A illustrated in FIG. 9 includes a transistor 201, a transistor 205, a transistor 206, the light-emitting device 190R, the light-receiving device 110, the protective layer 116, and the like between the substrate 151 and the substrate 152.

The substrate 152 and the protective layer 116 are bonded to each other with an adhesive layer 142*a* and an adhesive layer 142*b*. A solid sealing structure, a hollow sealing structure, or the like can be employed to seal the light-emitting device 190R and the light-receiving device 110. In FIG. 9, a space surrounded by the substrate 152, the frame-shaped adhesive layer 142*b*, and the substrate 151 is filled with the adhesive layer 142*a*, and the solid sealing structure is employed. Note that the substrate 152 and the protective layer 116 may be attached to each other by one kind of adhesive layer without providing a frame-like adhesive layer. Alternatively, a hollow sealing structure may be employed, in which the space is filled with an inert gas (e.g., nitrogen or argon).

The light-emitting device 190R has a stacked-layer structure in which the pixel electrode 111R, the common layer 112, the light-emitting layer 113R emitting red light, the common layer 114, and the common electrode 115 are stacked in this order from the insulating layer 214 side. The pixel electrode 111R is connected to a conductive layer 222*b* included in the transistor 206 through the opening provided in the insulating layer 214.

The end portion of the pixel electrode 111R is covered with the partition 216. The pixel electrode 111R includes a material that reflects visible light, and the common electrode 115 includes a material that transmits visible light.

The light-receiving device 110 has a stacked-layer structure in which the pixel electrode 111S, the common layer 112, the active layer 113S, the common layer 114, and the common electrode 115 are stacked in this order from the insulating layer 214 side. The pixel electrode 111S is electrically connected to the conductive layer 222*b* included in the transistor 205 through the opening provided in the insulating layer 214. The end portion of the pixel electrode 111S is covered with the partition 216. The pixel electrode 111S includes a material that reflects visible light, and the common electrode 115 includes a material that transmits visible light.

Light from the light-emitting device 190R is emitted toward the substrate 152 side. Light enters the light-receiving device 110 through the substrate 152 and the adhesive layer 142*a*. For the substrate 152, a material having a high visible-light-transmitting property is preferably used.

The pixel electrode 111R and the pixel electrode 111S can be formed using the same material in the same process. The common layer 112, the common layer 114, and the common electrode 115 are used in both the light-receiving device 110 and the light-emitting device 190R. The light-receiving device 110 and the light-emitting device 190R can have a common structure except the active layer 113S and the light-emitting layer 113R. Thus, the light-receiving device 110 can be incorporated in the display apparatus 100A without a significant increase in the number of manufacturing steps.

The partition 216 covers the end portion of the pixel electrode 111S and the end portion of the pixel electrode 111R. Over the partition 216, there is the region SR where the light-emitting layer 113R and the active layer 113S overlap with each other.

Providing the protective layer 116 that covers the light-receiving device 110 and the light-emitting device 190R can inhibit entry of impurities such as water into the light-receiving device 110 and the light-emitting device 190R, thereby increasing the reliability of the light-receiving device 110 and the light-emitting device 190R.

The transistor 201, the transistor 205, and the transistor 206 are formed over the substrate 151. These transistors can be formed using the same material in the same process.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, and an aluminum nitride film can be given. Furthermore, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like can be given. A stack including two or more of the above insulating films may also be used.

Here, an organic insulating film often has a lower barrier property than an inorganic insulating film. Therefore, an organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side of the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 9, the opening is formed in the insulating layer 214. This can inhibit entry of impurities into the display portion 162 from the outside through the insulating layer 214 even when an organic insulating film is used as the insulating layer 214. Thus, the reliability of the display apparatus 100A can be increased.

In the region 228 in the vicinity of the end portion of the display apparatus 100A, the insulating layer 215 and the protective layer 116 are preferably in contact with each other through the opening in the insulating layer 214. In particular, the inorganic insulating film included in the insulating layer 215 and an inorganic insulating film included in the protective layer 116 are preferably in contact with each other. This can inhibit entry of impurities into the display portion 162 from the outside through the organic insulating film. Thus, the reliability of the display apparatus 100A can be increased.

The protective layer 116 preferably includes at least one layer of an inorganic insulating film. The protective layer 116 may have a single-layer structure or a stacked-layer structure including two or more layers. For example, the protective layer 116 may have a three-layer structure in which a first inorganic insulating film, an organic insulating film, and a second inorganic insulating film are stacked in this order.

Each of the transistor 201, the transistor 205, and the transistor 206 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structures of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

A structure in which the semiconductor layer where a channel is formed is provided between two gates is used for the transistor 201, the transistor 205, and the transistor 206. The two gates may be connected to each other and supplied with the same signal to drive the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

The semiconductor layer of the transistor preferably contains a metal oxide (also referred to as an oxide semiconductor). That is, a transistor containing a metal oxide in its channel formation region (hereinafter, also referred to as an OS transistor) is preferably used for the display apparatus of this embodiment.

As the oxide semiconductor having crystallinity, a CAAC (c-axis aligned crystalline)-OS, an nc (nanocrystalline)-OS, and the like are given.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter, also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and component costs and mounting costs can be reduced.

An OS transistor has extremely high field-effect mobility compared to a transistor using amorphous silicon. In addition, the OS transistor has extremely low leakage current between a source and a drain in an off state (hereinafter, also referred to as off-state current), and charge accumulated in a capacitor that is connected in series to the transistor can be held for a long period. Furthermore, power consumption of the display apparatus can be reduced with the OS transistor.

The off-state current value per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of current flowing when the transistor operates in a saturation region, an OS transistor can feed more stable current (saturation current) than a Si transistor even when the source-drain voltage gradually increases. Thus, by using an OS transistor as the driving transistor, stable current can be fed through the light-emitting device even when the current-voltage characteristics of the EL device vary, for example. In other words, when the OS transistor operates in the saturation region, the source-drain current hardly changes with an increase in the source-drain voltage; hence, the emission luminance of the light-emitting device can be stable.

As described above, with the use of an OS transistor as the driving transistor included in the pixel circuit, it is possible to achieve "inhibition of black floating", "increase in emission luminance", "increase in gray level", "inhibition of variation in light-emitting devices", and the like.

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer. Alternatively, it is preferable to use an oxide containing indium, tin, and zinc. Alternatively, it is preferable to use an oxide containing indium, gallium, tin, and zinc. Alternatively, it is preferable to use an oxide containing indium (In), aluminum (Al), and zinc (Zn) (also referred to as IAZO). Alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, and In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is higher than or equal to 1 and lower than or equal to 3 and the atomic ratio of Zn is higher than or equal to 2 and lower than or equal to 4 with In being 4. When the atomic ratio is described as In:Ga:Zn=5:1:6 or a composition in the neighborhood thereof, the case is included where the atomic ratio of Ga is higher than 0.1 and lower than or equal to 2 and the atomic ratio of Zn is higher than or equal to 5 and lower than or equal to 7 with In being 5. When the atomic ratio is described as In:Ga:Zn=1:1:1 or a composition in the neighborhood thereof, the case is included where the atomic ratio of Ga is higher than 0.1 and lower than or equal to 2 and the atomic ratio of Zn is higher than 0.1 and lower than or equal to 2 with In being 1.

A transistor included in the circuit 164 and a transistor included in the display portion 162 may have the same structure or different structures. A plurality of transistors included in the circuit 164 may have either the same structure or two or more kinds of structures. Similarly, a plurality of transistors included in the display portion 162 may have either the same structure or two or more kinds of structures.

All of the transistors included in the display portion 162 may be OS transistors or all of the transistors included in the display portion 162 may be Si transistors. Alternatively, some of the transistors included in the display portion 162 may be OS transistors and the others may be Si transistors.

For example, when both an LTPS transistor and an OS transistor are used in the display portion 162, the display apparatus with low power consumption and high drive capability can be achieved. Note that a structure in which an LTPS transistor and an OS transistor are used in combination is referred to as LTPO in some cases. As a favorable example, it is preferable to use an OS transistor as a transistor or the like functioning as a switch for controlling electrical continuity between wirings and an LTPS transistor as a transistor or the like for controlling current.

For example, one transistor included in the display portion 162 functions as a transistor for controlling current flowing through the light-emitting device and can also be referred to as a driving transistor. One of a source and a drain of the driving transistor is electrically connected to a pixel electrode of the light-emitting device. An LTPS transistor is preferably used as the driving transistor. In that case, the amount of current flowing through the light-emitting device can be increased in the pixel circuit.

By contrast, another transistor included in the display portion 162 functions as a switch for controlling selection or non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping a driver in displaying a still image.

As described above, the display apparatus of one embodiment of the present invention can have all of a high aperture ratio, high resolution, high display quality, and low power consumption.

A connection portion 204 is provided in a region of the substrate 151 where the substrate 152 does not overlap. In the connection portion 204, the wiring 165 is electrically connected to the FPC 172 through a conductive layer 166 and a connection layer 242. On a top surface of the connection portion 204, the conductive layer 166 obtained by processing the same conductive film as the pixel electrode 111S is exposed. Thus, the connection portion 204 and the FPC 172 can be electrically connected to each other through the connection layer 242.

A variety of optical members can be arranged on an outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

For each of the substrate 151 and the substrate 152, glass, quartz, ceramic, sapphire, resin, or the like can be used. When the substrate 151 and the substrate 152 are formed using a flexible material, the flexibility of the display apparatus can be increased and a flexible display can be achieved.

As the adhesive layer, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-component-mixture-type resin may be used. An adhesive sheet or the like may be used.

As the connection layer 242, an anisotropic conductive film (ACF), an anisotropic conductive paste (ACP), or the like can be used.

The light-emitting device included in the display apparatus of this embodiment may have any of a top-emission structure, a bottom-emission structure, and a dual-emission structure. A conductive film that transmits visible light is used as an electrode through which light is extracted. A conductive film that reflects visible light is preferably used as an electrode through which light is not extracted.

The light-emitting device includes at least the light-emitting layer. In addition to the light-emitting layer, the light-emitting device may further include a layer containing any of a substance with a high hole-injection property, a substance with a high hole-transport property (a hole-transport material), a hole-blocking material, an electron-blocking material, a substance with a high electron-transport property (a hole-transport material), a substance with a high electron-injection property, a substance with a bipolar property (a substance with a high electron-transport property and a high hole-transport property), and the like. For example, the common layer 112 preferably includes at least one of a hole-injection layer, a hole-transport layer, and an electron-blocking layer. For example, the common layer 114 preferably includes at least one of a hole-blocking layer, an electron-transport layer, and an electron-injection layer.

A hole-injection layer is a layer injecting holes from an anode to a hole-transport layer, and a layer containing a material with a high hole-injection property. Examples of a substance with a high hole-injection property include an aromatic amine compound and a composite material containing a hole-transport material and an acceptor material (electron-accepting material).

A hole-transport layer is a layer transporting holes, which are injected from an anode by a hole-injection layer, to a light-emitting layer. The hole-transport layer is a layer containing a hole-transport material. As the hole-transport material, a substance having a hole mobility higher than or equal to $1\times10^{-6}$ $cm^2/Vs$ is preferable. Note that other substances can also be used as long as they have a property of transporting more holes than electrons. As the hole-transport material, a substance with a high hole-transport property, such as a π-electron rich heteroaromatic compound (e.g., a carbazole derivative, a thiophene derivative, or a furan derivative) or an aromatic amine (compound having an aromatic amine skeleton), is preferable.

An electron-transport layer is a layer transporting electrons, which are injected from a cathode by an electron-injection layer, to a light-emitting layer. The electron-transport layer is a layer containing an electron-transport material. As the electron-transport material, a substance having an electron mobility higher than or equal to $1\times10^{-6}$ $cm^2/Vs$ is preferable. Note that other substances can also be used as long as they have a property of transporting more electrons than holes. As the electron-transport material, it is possible to use a substance with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

An electron-injection layer is a layer injecting electrons from a cathode to an electron-transport layer and a layer containing a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$; X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. In addition, the electron-injection layer may have a stacked-layer structure of two or more layers. In the stacked-layer structure, for example, lithium fluoride can be used for the first layer and ytterbium can be provided for the second layer.

Alternatively, for the electron-injection layer, an electron-transport material may be used. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3- a:2',3d'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The common layer 112, the light-emitting layer, and the common layer 114 may use either a low molecular compound or a high molecular compound and may also contain an inorganic compound. The layers that constitute the common layer 112, the light-emitting layer, and the common layer 114 can each be formed by a method such as an evaporation method (including a vacuum evaporation method), a transfer method, a printing method, an inkjet method, or a coating method.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

The light-receiving device includes at least an active layer that functions as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. When the light-receiving device is driven by application of reverse bias between the pixel electrode and the common electrode, light entering the light-receiving device can be detected and charge can be generated and extracted as current. Alternatively, the pixel electrode may function as a cathode and the common electrode may function as an anode.

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, in fullerene having a spherical shape, an electron-accepting property becomes high even when π-electron conjugation widely spreads. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-C71-butyric acid methyl ester (abbreviation: PC70BM), [6,6]-phenyl-C61-butyric acid methyl ester (abbreviation: PC60BM), and 1',1",4',4"-tetrahydro-di[1,4]methanonaphthaleno[1,2:2',3',56,60:2",3"][5,6]fullerene-C60 (abbreviation: ICBA).

Another example of an n-type semiconductor material is a perylenetetracarboxylic derivative such as N,N'-dimethyl-3,4,9,10-perylenetetracarboxylic diimide (abbreviation: Me-PTCDI).

Another example of an n-type semiconductor material is 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Furthermore, other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, a polythiophene derivative, and the like.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of the same kind, which have molecular orbital energy levels close to each other, can improve a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without being limited to the above, the light-receiving device may further include a layer containing any of a substance with a high hole-injection property, a hole-blocking material, a substance with a high electron-injection property, an electron-blocking material, or the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material or the electron-blocking material, a high molecular compound such as poly(3,4-ethylenedioxythiophene)/poly(styrenesulfonic acid) (PEDOT/PSS), and an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

Three or more kinds of materials may be used for the active layer. For example, a third material may be mixed with an n-type semiconductor material and a p-type semiconductor material in order to extend the absorption wavelength range. In this case, the third material may be a low molecular compound or a high molecular compound.

As materials for a gate, a source, and a drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, one or more of a metal material such as gold, silver, platinum, magnesium, nickel, tungsten, chromium, molybdenum, iron, cobalt, copper, palladium, or titanium, and an alloy material containing the metal material can be used. Alternatively, a nitride of the metal material (e.g., titanium nitride) or the like may be used. Note that in the case of using the metal material or the alloy material (or the nitride thereof), the thickness is preferably set small enough to have a light-transmitting property. Furthermore, a stacked-layer film of the above materials can be used as a conductive layer. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layers functioning as a pixel electrode or a common electrode) included in a display device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

<Display Apparatus 100B>

Figure 10:
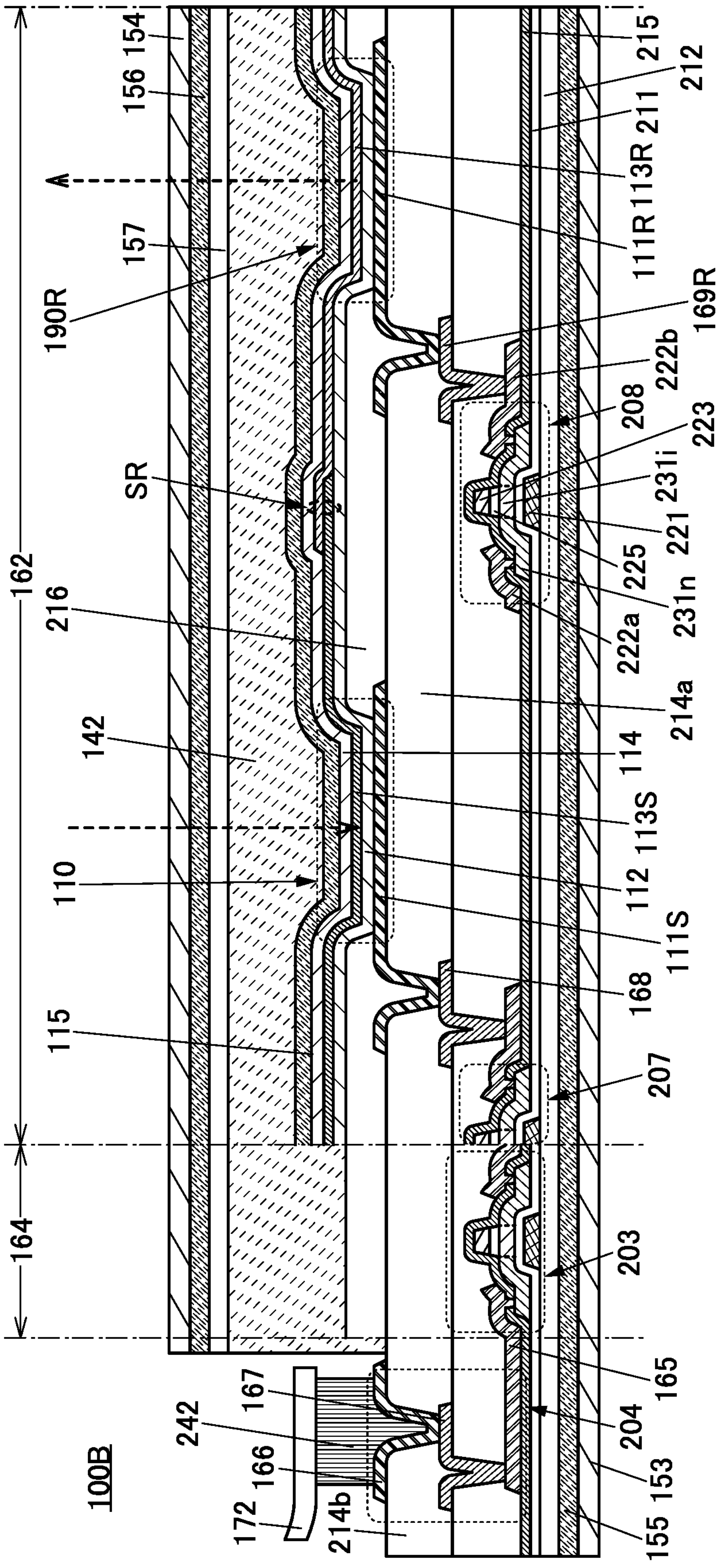
FIG. 10 is a cross-sectional view illustrating an example of a display apparatus.
Figure 11A:
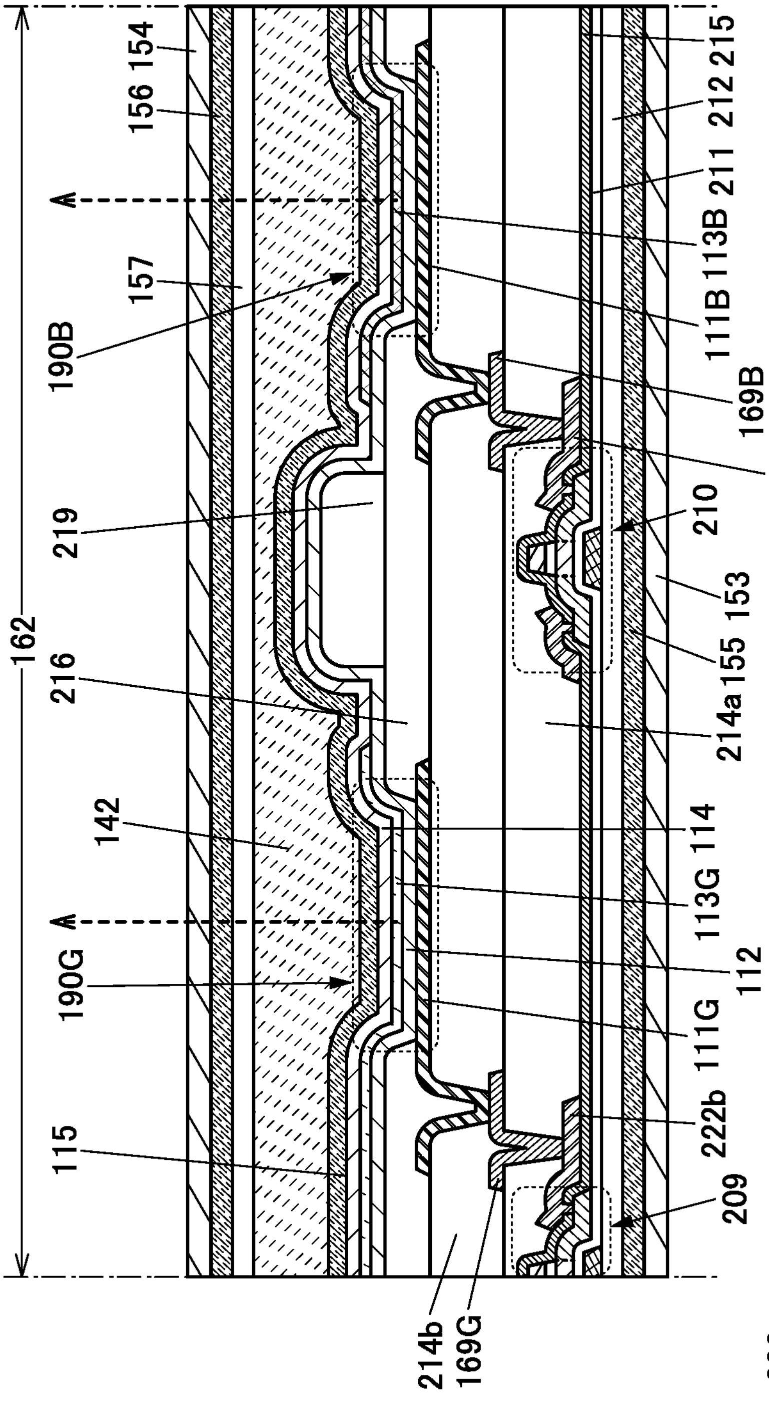
FIG. 11A is a cross-sectional view illustrating an example of a display apparatus.

FIG. 10 and FIG. 11A show a cross section of a display apparatus 100B. A perspective view of the display apparatus 100B is similar to that of the display apparatus 100A (FIG. 8). FIG. 10 illustrates an example of a cross section including part of a region including the FPC 172, part of the circuit 164, and part of the display portion 162 in the display apparatus 100B. FIG. 11A illustrates an example of a cross section of part of the display portion 162 in the display apparatus 100B. FIG. 10 specifically illustrates an example of a cross section of a region including the light-receiving device 110 and the light-emitting device 190R emitting red light in the display portion 162. FIG. 11A specifically illustrates an example of a cross section of a region including the light-emitting device 190G emitting green light and the light-emitting device 190B emitting blue light in the display portion 162.

The display apparatus 100B illustrated in FIG. 10 and FIG. 11A includes a transistor 203, a transistor 207, a transistor 208, a transistor 209, a transistor 210, the light-emitting device 190R, the light-emitting device 190G, the light-emitting device 190B, the light-receiving device 110, and the like between a substrate 153 and a substrate 154. Furthermore, a protective layer may be provided over the light-emitting device 190R, the light-emitting device 190G, the light-emitting device 190B, and the light-receiving device 110.

An insulating layer 157 and the common electrode 115 are bonded to each other with the adhesive layer 142, and the display apparatus 100B employs a solid sealing structure.

The substrate 153 and an insulating layer 212 are attached to each other with an adhesive layer 155. The substrate 154 and the insulating layer 157 are attached to each other with an adhesive layer 156.

To manufacture the display apparatus 100B, first, a first formation substrate provided with the insulating layer 212, the transistors, the light-receiving device 110, the light-emitting devices, and the like and a second formation substrate provided with the insulating layer 157 and the like are attached to each other with the adhesive layer 142. Then, the substrate 153 is attached to a surface exposed by separation of the first formation substrate, and the substrate 154 is attached to a surface exposed by separation of the second formation substrate, whereby the components formed over the first formation substrate and the second formation substrate are transferred to the substrate 153 and the substrate 154. The substrate 153 and the substrate 154 are preferably flexible. Accordingly, the display apparatus 100B can be highly flexible.

For each of the substrate 153 and the substrate 154, it is possible to use, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 153 and the substrate 154.

As the substrate included in the display apparatus of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

The inorganic insulating film that can be used as the insulating layer 211, the insulating layer 213, and the insulating layer 215 can be used as the insulating layer 212 and the insulating layer 157.

The light-emitting device 190R has a stacked-layer structure in which the pixel electrode 111R, the common layer 112, the light-emitting layer 113R, the common layer 114, and the common electrode 115 are stacked in this order from an insulating layer 214*b* side. The pixel electrode 111R is connected to a conductive layer 169R through an opening provided in the insulating layer 214*b*. The conductive layer 169R is connected to the conductive layer 222*b* included in the transistor 208 through an opening provided in an insulating layer 214*a*. The conductive layer 222*b* is connected to a low-resistance region 231*n* through an opening provided in the insulating layer 215. That is, the pixel electrode 111R is electrically connected to the transistor 208. The transistor 208 has a function of controlling the driving of the light-emitting device 190R.

Similarly, the light-emitting device 190G has a stacked-layer structure in which the pixel electrode 111G, the common layer 112, the light-emitting layer 113G, the common layer 114, and the common electrode 115 are stacked in this order from the insulating layer 214*b* side. The pixel electrode 111G is electrically connected to the low-resistance region 231*n* of the transistor 209 through a conductive layer 169G and the conductive layer 222*b* of the transistor 209. That is, the pixel electrode 111G is electrically connected to the transistor 209. The transistor 209 has a function of controlling the driving of the light-emitting device 190G.

The light-emitting device 190B has a stacked-layer structure in which the pixel electrode 111B, the common layer 112, the light-emitting layer 113B, the common layer 114, and the common electrode 115 are stacked in this order from the insulating layer 214*b* side. The pixel electrode 111B is electrically connected to the low-resistance region 231*n* of the transistor 210 through a conductive layer 169B and the conductive layer 222*b* of the transistor 210. That is, the pixel electrode 111B is electrically connected to the transistor 210. The transistor 210 has a function of controlling the driving of the light-emitting device 190B.

The light-receiving device 110 has a stacked-layer structure in which the pixel electrode 111S, the common layer 112, the active layer 113S, the common layer 114, and the common electrode 115 are stacked in that order from the insulating layer 214*b* side. The pixel electrode 111S is electrically connected to the low-resistance region 231*n* of the transistor 207 through a conductive layer 168 and the conductive layer 222*b* of the transistor 207. That is, the pixel electrode 111S is electrically connected to the transistor 207.

The end portions of the pixel electrodes 111S, 111R, 111G, and 111B are covered with the partition 216. The pixel electrodes 111S, 111R, 111G, and 111B contain a material that reflects visible light, and the common electrode 115 contains a material that transmits visible light.

Over the partition 216, there is the region SR where the light-emitting layer 113R and the active layer 113S overlap with each other. As illustrated in FIG. 11A, the spacer 219 is provided over the partition 216. In a process for manufacturing the display apparatus, the spacer 219 may be in direct contact with a metal mask. In this case, the light-emitting layer 113G and the light-emitting layer 113B are not formed over the spacer 219 as illustrated in FIG. 11A.

Light from the light-emitting devices 190R, 190G, and 190B is emitted toward the substrate 154 side. Light enters the light-receiving device 110 through the substrate 154 and the adhesive layer 142. For the substrate 154, a material having a high visible-light-transmitting property is preferably used.

The pixel electrodes 111S, 111R, 111G, and 111B can be formed using the same material in the same process. The common layer 112, the common layer 114, and the common electrode 115 are used in common in the light-receiving device 110 and the light-emitting devices 190R, 190G, and 190B. The light-receiving device 110 and the light-emitting device of each color can have a common structure except for the active layer 113S and the light-emitting layers. Thus, the light-receiving device 110 can be incorporated in the display apparatus 100B without a significant increase in the number of manufacturing steps.

A light-shielding layer may be provided on a surface of the insulating layer 157 on the substrate 153 side. Providing the light-shielding layer can control the range where the light-receiving device 110 detects light. Furthermore, with the light-shielding layer 158, light can be inhibited from directly entering the light-receiving device 110 from the light-emitting devices 190R, 190G, and 190B without passing through an object. Hence, a sensor with less noise and high sensitivity can be obtained.

The connection portion 204 is provided in a region of the substrate 153 where the substrate 154 does not overlap. In the connection portion 204, the wiring 165 is electrically connected to the FPC 172 through a conductive layer 167, the conductive layer 166, and the connection layer 242. The conductive layer 167 can be obtained by processing the same conductive film as the conductive layer 168. On a top surface of the connection portion 204, the conductive layer 166 obtained by processing the same conductive film as the pixel electrode 111S is exposed. Thus, the connection portion 204 and the FPC 172 can be electrically connected to each other through the connection layer 242.

Each of the transistor 207, the transistor 208, the transistor 209, and the transistor 210 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*.

The insulating layer 225 is positioned between the conductive layer 223 and the channel formation region 231*i*.

The conductive layer 222*a* and the conductive layer 222*b* are connected to the low-resistance regions 231*n* through openings provided in the insulating layer 215. One of the conductive layer 222*a* and the conductive layer 222*b* functions as a source, and the other functions as a drain.

In FIG. 10, the insulating layer 225 overlaps with the channel formation region 231*i* of the semiconductor layer 231 and does not overlap with the low-resistance regions 231*n*. The structure shown in FIG. 10 can be fabricated by processing the insulating layer 225 using the conductive layer 223 as a mask, for example. In FIG. 10, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, the protective layer 116 covering the transistors may be provided.

Figure 11B:
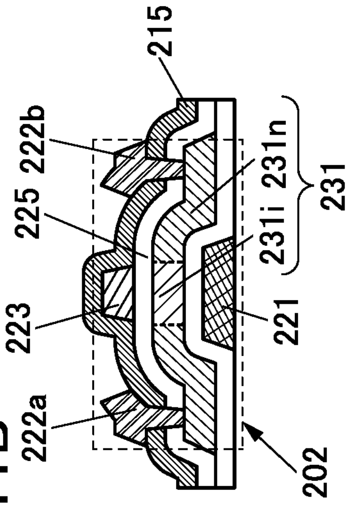
FIG. 11B is a cross-sectional view illustrating an example of a transistor.

In contrast, FIG. 11B illustrates an example of a transistor 202 in which the insulating layer 225 covers a top surface and a side surface of the semiconductor layer. The conductive layer 222*a* and the conductive layer 222*b* are connected to the low-resistance regions 231*n* through openings provided in the insulating layer 225 and the insulating layer 215.

As described above, the display apparatus of this embodiment includes a light-receiving device and a light-emitting device in a display portion, and the display portion has both a function of displaying an image and a function of detecting light. Thus, the size and weight of an electronic device can be reduced as compared to the case where a sensor is provided outside the display portion or outside the display apparatus. Moreover, an electronic device having more functions can be achieved by a combination of the display apparatus of this embodiment and a sensor provided outside the display portion or outside the display apparatus.

In the light-receiving device, at least one of the layers provided between a pair of electrodes can be shared with the light-emitting device (EL device). For example, all the layers in the light-receiving device except the active layer can have structures in common with the layers in the light-emitting device (EL device). In other words, with only the addition of the step of forming the active layer to the manufacturing process of the light-emitting device, the light-emitting device and the light-receiving device can be formed over one substrate. In the light-receiving device and the light-emitting device, their pixel electrodes can be formed using the same material in the same process, and their common electrodes can be formed using the same material in the same step. When a circuit electrically connected to the light-receiving device and a circuit electrically connected to the light-emitting device are formed using the same material in the same process, the manufacturing process of the display apparatus can be simplified. In such a manner, a display apparatus that incorporates a light-receiving device and is highly convenient can be manufactured without complicated processes.

This embodiment can be combined with the other embodiments as appropriate. In the case where a plurality of structure examples are described in one embodiment in this specification, the structure examples can be combined as appropriate.

Embodiment 2

In this embodiment, a display apparatus of one embodiment of the present invention will be described with reference to FIG. 12A and FIG. 12B.

A display apparatus of one embodiment of the present invention includes a first pixel circuit including a light-receiving device and a second pixel circuit including a light-emitting device. The first pixel circuits and the second pixel circuits are arranged in a matrix.

Figure 12A:
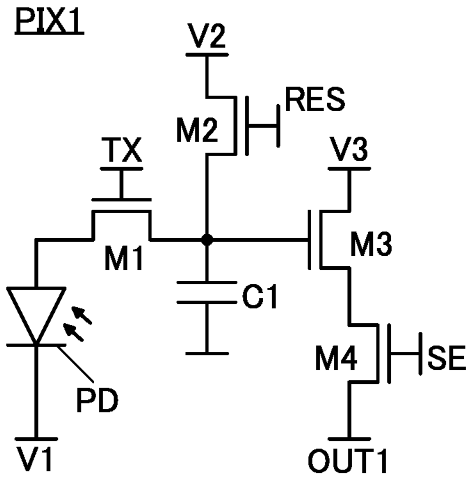
FIG. 12A and FIG. 12B are circuit diagrams illustrating examples of pixel circuits.

FIG. 12A illustrates an example of the first pixel circuit including a light-receiving device. FIG. 12B illustrates an example of the second pixel circuit including a light-emitting device.

A pixel circuit PIX1 illustrated in FIG. 12A includes a light-receiving device PD, a transistor M1, a transistor M2, a transistor M3, a transistor M4, and a capacitor C1. Here, an example in which a photodiode is used as the light-receiving device PD is illustrated.

A cathode of the light-receiving device PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

Constant potentials are supplied to the wiring V1, the wiring V2, and the wiring V3. When the light-receiving device PD is driven with a reverse bias, the wiring V2 can be supplied with a potential lower than the potential of the wiring V1. The transistor M2 is controlled by a signal supplied to the wiring RES and has a function of resetting a potential of a node connected to the gate of the transistor M3 to a potential supplied to the wiring V2. The transistor M1 is controlled by a signal supplied to the wiring TX and has a function of controlling the timing at which the potential of the node changes, in accordance with current flowing through the light-receiving device PD. The transistor M3 functions as an amplifier transistor for performing output in response to the potential of the node. The transistor M4 is controlled by a signal supplied to the wiring SE and functions as a selection transistor for making an external circuit connected to the wiring OUT1 read the output corresponding to the potential of the node.

Figure 12B:
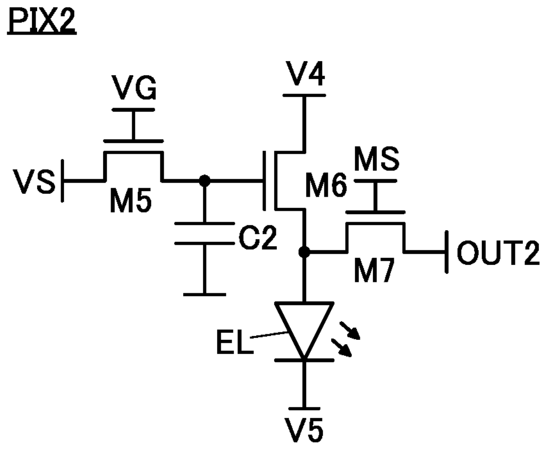

A pixel circuit PIX2 illustrated in FIG. 12B includes a light-emitting device EL, a transistor M5, a transistor M6, a transistor M7, and a capacitor C2. Here, an example in which a light-emitting diode is used as the light-emitting device EL is illustrated. In particular, an organic EL device is preferably used as the light-emitting device EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting device EL and one of a source and a drain of the transistor M7. A gate of the transistor M7 is electrically connected to a wiring MS, and the other of the source and the drain is electrically connected to a wiring OUT2. A cathode of the light-emitting device EL is electrically connected to a wiring V5.

Constant potentials are supplied to the wiring V4 and the wiring V5. In the light-emitting device EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor for controlling current flowing through the light-emitting device EL in accordance with a potential supplied to the gate. When the transistor M5 is in an on state, a potential supplied to the wiring VS is supplied to the gate of the transistor M6, and the emission luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

Here, a transistor in which a metal oxide (oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve extremely low off-state current. Thus, such low off-state current enables retention of charges accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility can be achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 12A and FIG. 12B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuits PIX1 and the transistors included in the pixel circuits PIX2 be periodically arranged in one region.

One or more layers including one or both of the transistor and the capacitor are preferably provided to overlap with the light-receiving device PD or the light-emitting device EL. Thus, the effective area of each pixel circuit can be reduced, and a high-resolution light-receiving portion or display portion can be achieved.

This embodiment can be combined with the other embodiment as appropriate.

Embodiment 3

In this embodiment, electronic devices of one embodiment of the present invention will be described with reference to FIG. 13A to FIG. 16G.

An electronic device in this embodiment is provided with the display apparatus of one embodiment of the present invention. For example, the display apparatus of one embodiment of the present invention can be used in a display portion of the electronic device. The display apparatus of one embodiment of the present invention has a function of detecting light, and thus can perform biological authentication with the display portion or detect touch (contact or approach) on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 13A:
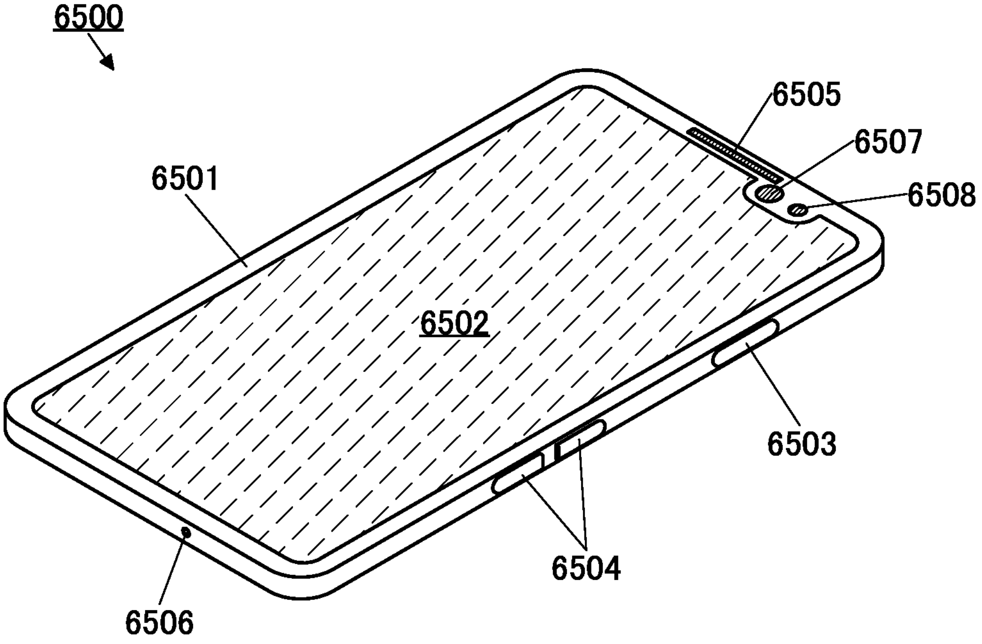
FIG. 13A and FIG. 13B are diagrams illustrating an example of an electronic device.

An electronic device 6500 illustrated in FIG. 13A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 13B:
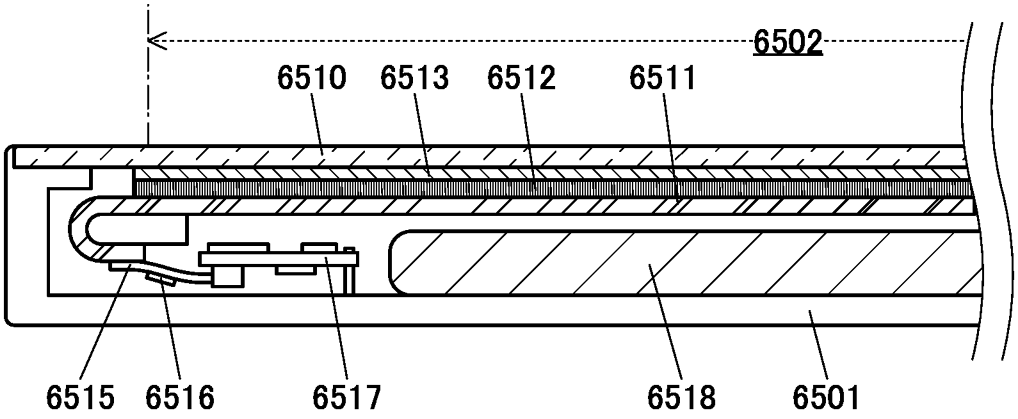

FIG. 13B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 14A:
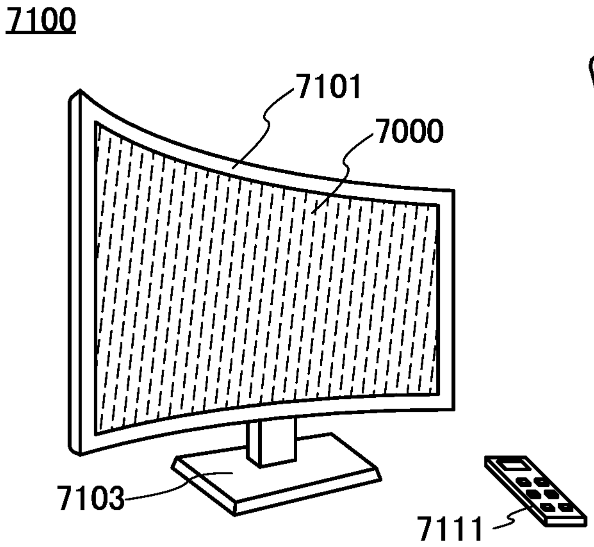
FIG. 14A to FIG. 14D are diagrams illustrating examples of electronic devices.

FIG. 14A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used in the display portion 7000.

Operation of the television device 7100 illustrated in FIG. 14A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 14B:
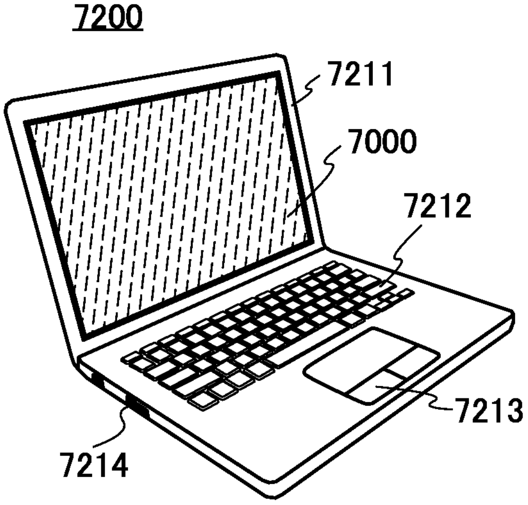

FIG. 14B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated. The display apparatus of one embodiment of the present invention can be used in the display portion 7000.

Figure 14C:
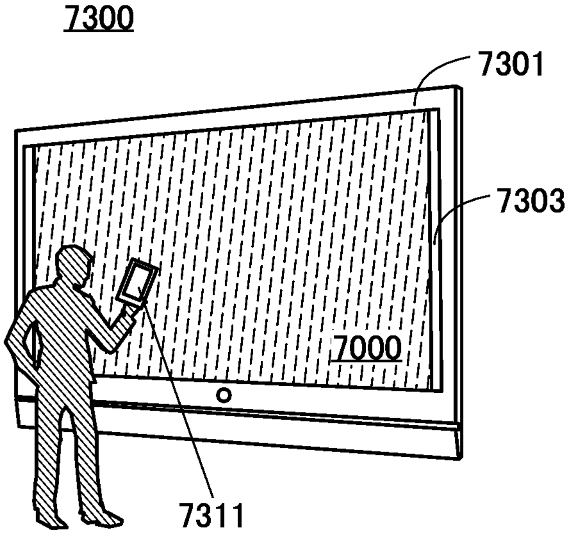
Figure 14D:
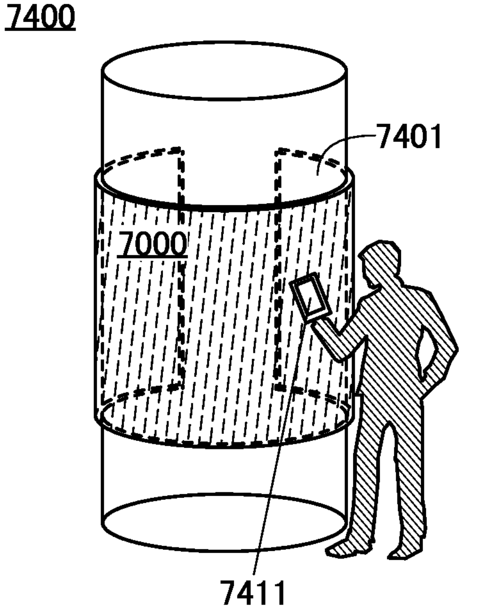

FIG. 14C and FIG. 14D illustrate examples of digital signage.

Digital signage 7300 illustrated in FIG. 14C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 14D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 14C and FIG. 14D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 14C and FIG. 14D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 15A:
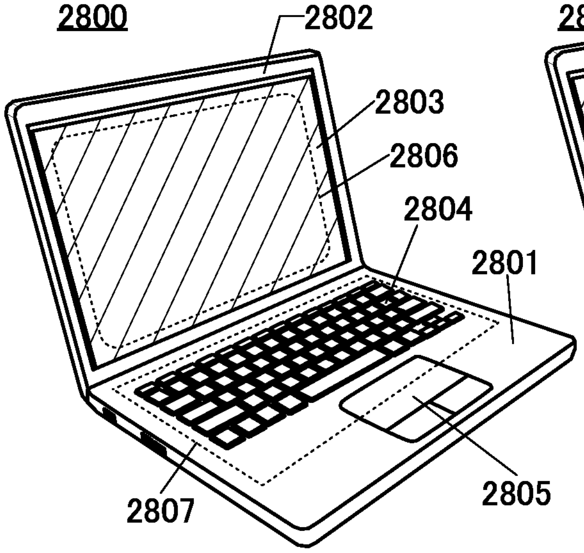
FIG. 15A to FIG. 15E are diagrams illustrating examples of an electronic device.
Figure 15B:
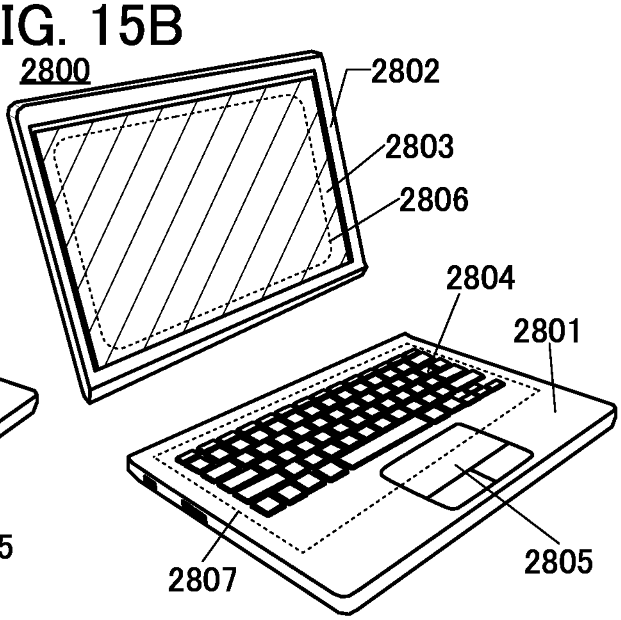

A personal computer 2800 illustrated in FIG. 15A includes a housing 2801, a housing 2802, a display portion 2803, a keyboard 2804, a pointing device 2805, and the like. A secondary battery 2807 is provided inside the housing 2801, and a secondary battery 2806 is provided inside the housing 2802. The display portion 2803 includes the display apparatus of one embodiment of the present invention, and has a touch panel function. As illustrated in FIG. 15B, the housing 2801 and the housing 2802 of the personal computer 2800 can be detached and the housing 2802 can be used alone as a tablet terminal.

Figure 15C:
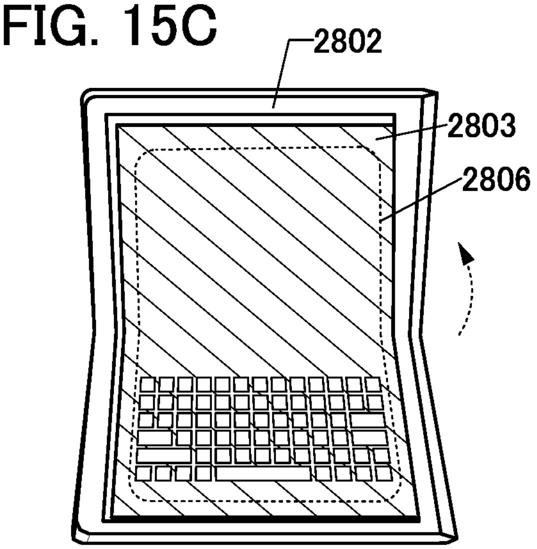

In a modification example of a personal computer illustrated in FIG. 15C, a flexible display is employed for the display portion 2803. With use of a flexible film as an exterior body, the secondary battery 2806 can be a bendable secondary battery. Accordingly, the housing 2802, the display portion 2803, and the secondary battery 2806 can be used in a bent state as illustrated in FIG. 15C. In this case, part of the display portion 2803 can be used as a keyboard as illustrated in FIG. 15C.

Figure 15D:
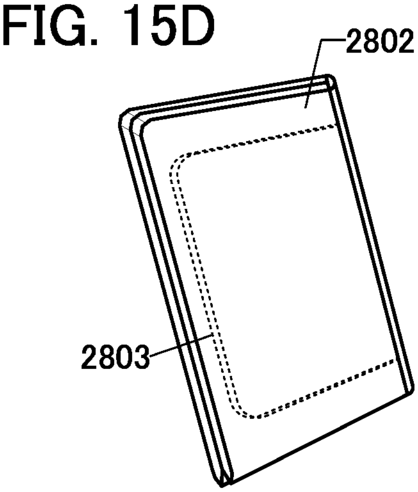
Figure 15E:
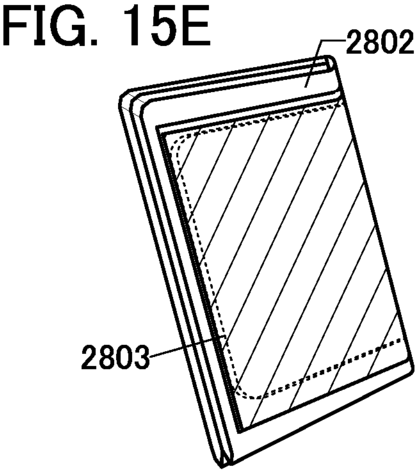

Furthermore, the housing 2802 can be folded such that the display portion 2803 is placed inward as illustrated in FIG. 15D, and the housing 2802 can be folded such that the display portion 2803 faces outward as illustrated in FIG. 15E.

Electronic devices illustrated in FIG. 16A to FIG. 16G include a housing 9000, a display portion 9001, a speaker 9003, an operation key 9005 (including a power switch or an operation switch), a connection terminal 9006, a sensor 9007 (sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display apparatus of one embodiment of the present invention can be used for the display portion 9001 in FIG. 16A to FIG. 16G.

The electronic devices illustrated in FIG. 16A to FIG. 16G have a variety of functions. For example, the electronic devices can have a function of displaying a variety of data (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (external recording medium or a recording medium incorporated in the camera), a function of displaying the taken image on the display portion, or the like.

The details of the electronic devices illustrated in FIG. 16A to FIG. 16G are described below.

Figure 16A:
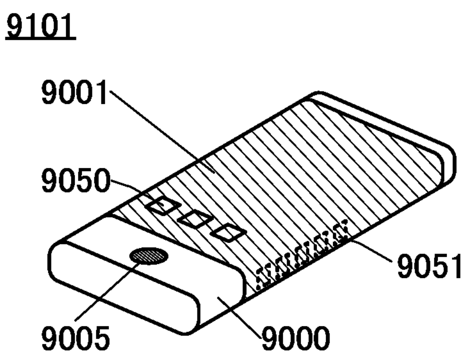
FIG. 16A to FIG. 16G are diagrams illustrating examples of electronic devices.

FIG. 16A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 16A illustrates an example where three icons 9050 are displayed. Information 9051 indicated by dashed rectangles can be displayed on another surface of the display portion 9001. Examples of the information 9051 include notification of reception of an e-mail, SNS, and an incoming call, the title and sender of an e-mail, SNS, or the like, the date, the time, remaining battery, and the radio field intensity. Alternatively, the icon 9050 or the like may be displayed in the position where the information 9051 is displayed.

Figure 16B:
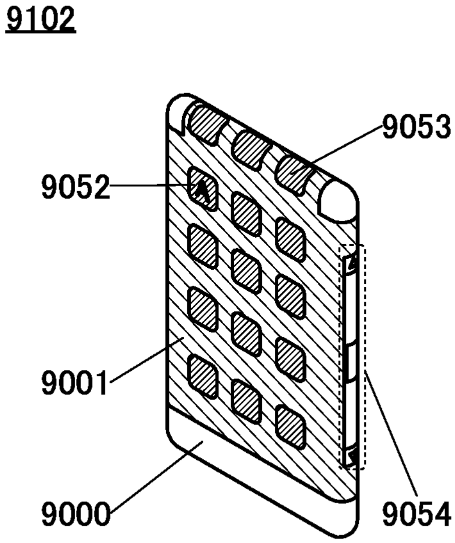

FIG. 16B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 16C:
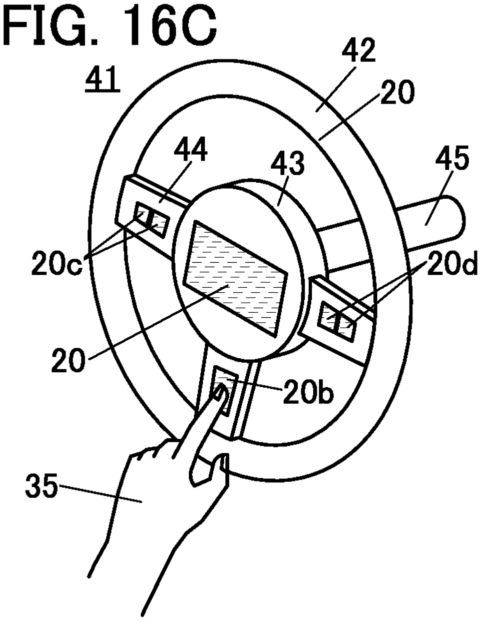

FIG. 16C is a perspective view of a steering wheel of a vehicle. A steering wheel 41 includes a rim 42, a hub 43, spokes 44, a shaft 45, and the like. A display portion 20 is provided on the surface of the hub 43. The number of spokes here is three. The spoke located on the lower side is provided with a light-receiving and light-emitting portion 20*b*; the spoke located on the left side is provided with a plurality of light-receiving and light-emitting portions 20*c*; and the spoke located on the right side is provided with a plurality of light-receiving and light-emitting portions 20*d*. When a driver holds a finger of a hand 35 over the light-receiving and light-emitting portion 20*b*, information on a fingerprint of the driver is obtained, and user authentication can be performed with the information. Touching the light-receiving and light-emitting portions 20*c*, the light-receiving and light-emitting portions 20*d*, and the like, the driver can operate a navigation system, an audio system, a call system, and the like included in the vehicle. In addition, a variety of operations such as adjustment of a rearview mirror and a sideview mirror, turning on/off of an interior light, adjustment of luminance, and opening/closing a window are possible.

Figure 16D:
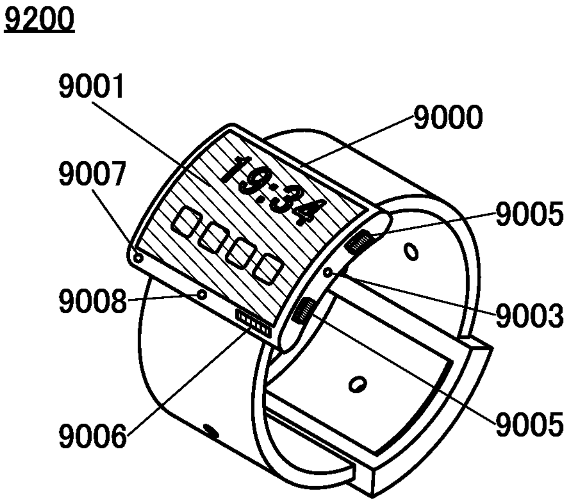

FIG. 16D is a perspective view illustrating a watch-type portable information terminal 9200. For example, the portable information terminal 9200 can be used as a smart watch (registered trademark). The display surface of the display portion 9001 is curved, and display can be performed on the curved display surface. For example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 16E:
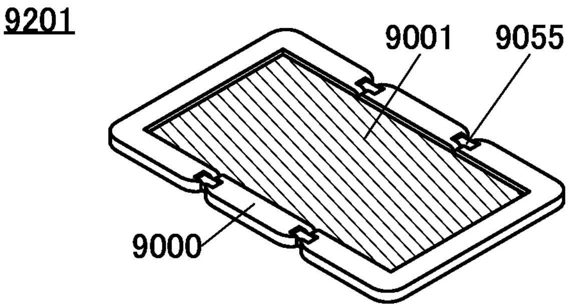
Figure 16F:
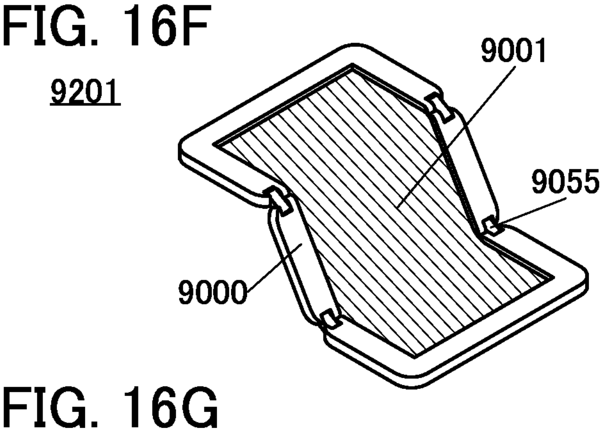
Figure 16G:
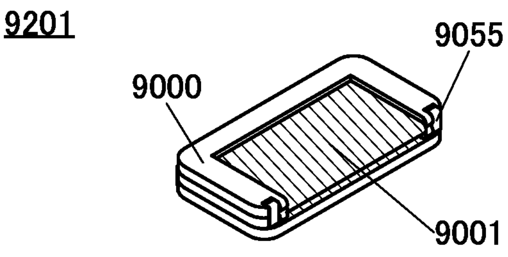

FIG. 16E to FIG. 16G are perspective views illustrating a foldable portable information terminal 9201. The perspective view of FIG. 16E illustrates an opened state of the portable information terminal 9201, the perspective view of FIG. 16G illustrates a folded state thereof, and the perspective view of FIG. 16F illustrates a state in the middle of change from one of FIG. 16E and FIG. 16G to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments and the examples as appropriate.

REFERENCE NUMERALS

GB: region, GR: region, MS: wiring, PD: light-receiving device, RES: wiring, SB: region, SE: wiring, SR: region, TX: wiring, VG: wiring, VS: wiring, 10A: display apparatus, 10B: display apparatus, 20*b*: light-receiving and light-emitting portion, 20*c*: light-receiving and light-emitting portion, 20*d*: light-receiving and light-emitting portion, 20: display portion, 21B: light, 21G: light, 21R: light, 22: light, 35: hand, 41: steering wheel, 42B: transistor, 42G: transistor, 42R: transistor, 42S: transistor, 42: rim, 43: hub, 44: spoke, 45: shaft, 50A: display apparatus, 50B: display apparatus, 51: substrate, 52: finger, 53: layer, 55: layer, 57: layer, 59: substrate, 100A: display apparatus, 100B: display apparatus, 105: insulating layer, 109*a*: pixel, 109*b*: pixel, 110: light-receiving device, 111B: pixel electrode, 111C: conductive layer, 111G: pixel electrode, 111R: pixel electrode, 111S: pixel electrode, 112R: functional layer, 112S: functional layer, 112: common layer, 113B: light-emitting layer, 113G: light-emitting layer, 113R: light-emitting layer, 113S: active layer, 114R: functional layer, 114S: functional layer, 114: common layer, 115: common electrode, 116: protective layer, 142*a*: adhesive layer, 142*b*: adhesive layer, 142: adhesive layer, 151B: FMM, 151G: FMM, 151R: FMM, 151S: FMM, 151: substrate, 152: substrate, 153: substrate, 154: substrate, 155: adhesive layer, 156: adhesive layer, 157: insulating layer, 158: light-shielding layer, 162: display portion, 164: circuit, 165: wiring, 166: conductive layer, 167: conductive layer, 168: conductive layer, 169B: conductive layer, 169G: conductive layer, 169R: conductive layer, 172: FPC, 173: IC, 190B: light-emitting device, 190G: light-emitting device, 190R: light-emitting device, 201:

transistor, 202: transistor, 203: transistor, 204: connection portion, 205: transistor, 206: transistor, 207: transistor, 208: transistor, 209: transistor, 210: transistor, 211: insulating layer, 212: insulating layer, 213: insulating layer, 214*a*: insulating layer, 214*b*: insulating layer, 214: insulating layer, 215: insulating layer, 216: partition, 219: spacer, 220: finger, 221: conductive layer, 222*a*: conductive layer, 222*b*: conductive layer, 222: fingerprint, 223: conductive layer, 224: contact portion, 225: insulating layer, 226: image-capturing range, 228: region, 231*i*: channel formation region, 231*n*: low-resistance region, 231: semiconductor layer, 242: connection layer, 2800: personal computer, 2801: housing, 2802: housing, 2803: display portion, 2804: keyboard, 2805: pointing device, 2806: secondary battery, 2807: secondary battery, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display apparatus comprising:

a light-receiving device;

a light-emitting device; and an insulating film, wherein the light-receiving device comprises a first electrode, an active layer over the first electrode, and a second electrode over the active layer, wherein the light-emitting device comprises a third electrode, a light-emitting layer over the third electrode, and the second electrode over the light-emitting layer, wherein an end portion of the first electrode and an end portion of the third electrode are covered with the insulating film, and wherein an end portion of the active layer and an end portion of the light-emitting layer overlap with each other in a region over the insulating film.

2. The display apparatus according to claim 1, wherein the light-receiving device and the light-emitting device comprise a common layer, and wherein the common layer is between the first electrode and the second electrode and between the first electrode and the third electrode.

3. The display apparatus according to claim 1, wherein the light-emitting layer is over the active layer.

4. The display apparatus according to claim 1, wherein the display apparatus has flexibility.

5. A display module comprising:

the display apparatus according to claim 1; and at least one of a connector and an integrated circuit.

6. An electronic device comprising:

the display module according to claim 5; and at least one of a housing, a battery, a camera, a speaker, and a microphone.

7. The display apparatus according to claim 1, wherein the end portion of the light-emitting layer is over and in contact with the end portion of the active layer.

8. A display apparatus comprising:

a light-receiving device;

a first light-emitting device;

a second light-emitting device; and an insulating film, wherein the light-receiving device comprises a first electrode, an active layer over the first electrode, and a second electrode over the active layer, wherein the first light-emitting device comprises a third electrode, a first light-emitting layer over the third electrode, and the second electrode over the first light-emitting layer, wherein the second light-emitting device comprises a fourth electrode, a second light-emitting layer over the fourth electrode, and the second electrode over the second light-emitting layer, wherein the first light-emitting layer and the second light-emitting layer comprise light-emitting materials different from each other, wherein an end portion of the first electrode and an end portion of the third electrode are covered with the insulating film, and wherein an end portion of the active layer and an end portion of the first light-emitting layer overlap with each other in a region over the insulating film.

9. The display apparatus according to claim 8, wherein the light-receiving device, the first light-emitting device, and the second light-emitting device comprise a common layer, and wherein the common layer is between the first electrode and the second electrode, between the first electrode and the third electrode, and between the fourth electrode and the third electrode.

10. The display apparatus according to claim 8, wherein the display apparatus has flexibility.

11. A display module comprising:

the display apparatus according to claim 4; and at least one of a connector and an integrated circuit.

12. An electronic device comprising:

the display module according to claim 10; and at least one of a housing, a battery, a camera, a speaker, and a microphone.

13. The display apparatus according to claim 8, wherein the end portion of the first light-emitting layer is over and in contact with the end portion of the active layer.

* * * * *